United States Patent
Sue et al.

(10) Patent No.: US 6,822,541 B2
(45) Date of Patent: Nov. 23, 2004

(54) ELECTROMAGNETIC WAVE ABSORBER AND HIGH-FREQUENCY CIRCUIT PACKAGE USING THE SAME

(75) Inventors: Toshiyuki Sue, Kokubu (JP); Kouji Enokida, Kokubu (JP); Yoshihiro Okawa, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 10/424,568

(22) Filed: Apr. 25, 2003

(65) Prior Publication Data

US 2004/0036559 A1 Feb. 26, 2004

(30) Foreign Application Priority Data

| Apr. 25, 2002 | (JP) | ................................ 2002-123945 |
| Jun. 18, 2002 | (JP) | ................................ 2002-177388 |
| Jun. 21, 2002 | (JP) | ................................ 2002-181679 |
| Oct. 8, 2002 | (JP) | ................................ 2002-294468 |

(51) Int. Cl.[7] .............................................. H01P 1/00
(52) U.S. Cl. ........................................ 333/247; 342/1
(58) Field of Search ................ 333/247; 342/1–12; 428/294.7, 323, 457

(56) References Cited

U.S. PATENT DOCUMENTS

| 6,214,454 B1 | * | 4/2001 | Kanda et al. | ............ 428/294.7 |
| 6,304,209 B1 | * | 10/2001 | Noda | ............................ 342/4 |
| 6,473,024 B2 | * | 10/2002 | Toyoda et al. | ................. 342/1 |

FOREIGN PATENT DOCUMENTS

| JP | 06-236935 | | 8/1994 | |
| JP | 2000165084 A | * | 6/2000 | ............ H05K/9/00 |

* cited by examiner

Primary Examiner—Timothy P. Callahan
Assistant Examiner—Cassandra Cox
(74) Attorney, Agent, or Firm—Hogan & Hartson, LLP

(57) ABSTRACT

The electromagnetic wave absorber of the present invention is made of a sintered body that contains Fe and at least one element selected from Si, Mg, Zr, Ni, Al and Co, and an attenuation of electromagnetic wave is 2 dB or more at frequencies of 10 GHz and higher so as to provide good electromagnetic wave absorbing characteristic with no corrosive gas generated at all, and is easy to manufacture. The electromagnetic wave absorber is used mainly as a component of a high-frequency circuit package.

20 Claims, 6 Drawing Sheets

ELECTROMAGNETIC WAVE ABSORBER AND HIGH-FREQUENCY CIRCUIT PACKAGE USING THE SAME

FIELD OF THE INVENTION

The present invention relates to an electromagnetic wave absorber having good electromagnetic wave absorbing characteristic and a high-frequency circuit package that uses the same.

BACKGROUND OF THE INVENTION

A high-frequency circuit package is usually sealed hermetically by attaching a package lid made of a metallic or ceramic material having rectangular parallelepiped shape onto a package base. Consequently, as a cavity of rectangular parallelepiped shape is formed in the high-frequency circuit package, the high-frequency circuit package has a nature similar to that of a rectangular cavity resonator. As a result, cavity resonance occurs in the high-frequency circuit package in a frequency region higher than a shut-off frequency that is determined by the dimensions of the cavity. Therefore, when a high-frequency semiconductor device or other circuit element that operates in this frequency region is mounted in the high-frequency circuit package, the cavity becomes small enough to make the shut-off frequency sufficiently higher than the frequency region in which the device operates.

With this method, however, there has been such a problem that the resonance frequency of the cavity becomes lower than the frequency region in which the device operates, as the operating frequency of the device becomes higher. Recently, to counter this problem, such a method has been employed that suppresses the cavity resonance by providing an electromagnetic wave absorber in the high-frequency circuit package thereby absorbing the energy of electric field or magnetic field generated by the cavity resonance.

The electromagnetic wave absorbers known to be used in the high-frequency circuit package contain an electromagnetic wave absorber 72 comprising a ferrite sheet having rectangular parallelepiped shape that is attached to the back surface of a package lid 71 of a high-frequency circuit package 70 shown in FIG. 11, and one that is coated with a ferrite coating material (Japanese Unexamined Patent Publication (Kokai) No. 6-236935).

However, the ferrite sheet attached to the inside of the high-frequency circuit package 70 and the ferrite coating material must contain at least 20% by weight of a synthetic resin, which leads to lower fire resistance. A common practice to solve this problem is to add a fire retardant such as decabromodiphenyl oxide, TBA epoxy oligomer-polymer or TBA carbonate oligomer, thereby to improve the fire resistance. However, these fire retardants are compounds containing Br and/or Cl, and evolve a gas containing Br and/or Cl when heated.

In case the electromagnetic wave absorber 72 containing such a fire retardant is attached to the inside of the high-frequency circuit package 70, heat generated when soldering the package lid 71 to the package base 73 or soldering the high-frequency circuit package 70 to a mother board (not shown) causes the evolution of a gas containing Br and/or Cl that fills the inside of the high-frequency circuit package 70. Since such a gas is corrosive in nature, the gas causes corrosion of a semiconductor device (not shown) mounted in the high-frequency circuit package 70 and a transmission line (not shown) that is formed on the package base 73.

Evolution of the gas may be avoided by using a functional ceramic material such as Ni ferrite, Ni—Zn ferrite or Mn—Zn ferrite for the electromagnetic wave absorber. However, such ferrite materials can be usually used only for an electromagnetic wave absorber intended for frequencies of several mega hertz. There have been demands for an electromagnetic wave absorber that can be used in high-frequency region of 10 GHz and higher, but desired electromagnetic wave absorbing characteristic cannot be achieved even with the electromagnetic wave absorber that can be used in high-frequency region of 10 GHz and higher.

SUMMARY OF THE INVENTION

A major object of the present invention is to provide an electromagnetic wave absorber that has good electromagnetic wave absorbing characteristic and does not generate a corrosive gas, and a high-frequency circuit package that uses the same.

Another object of the present invention is to provide an electromagnetic wave absorber that is used mainly as a component part of a high-frequency circuit package operating in a high-frequency region of 10 GHz and higher, and the high-frequency circuit package that uses the same.

Still another object of the present invention is to provide an electromagnetic wave absorber that can be easily manufactured and a high-frequency circuit package that uses the same.

In order to achieve the objects described above, the electromagnetic wave absorber of the present invention comprises a sintered body that contains Fe and at least one element selected from the group consisting of Si, Mg, Zr, Ni, Al and Co, wherein attenuation of electromagnetic wave of said sintered body is less than 2 dB at frequencies of 10 GHz or higher.

(1) The sintered body that contains Fe and at least one element selected from Si, Mg and Zr contains 20 to 95 mol % of Fe on $Fe_2O_3$ basis, and 5 to 80 mol % in total of at least one element selected from Si, Mg and Zr on $SiO_2$, MgO and/or $ZrO_2$ basis. The sintered body may also contain 1 to 50 mol % of Al on $Al_2O_3$ basis. The Fe content is more preferably in a range from 40 to 90 mol % on $Fe_2O_3$ basis.

(2) The sintered body that contains Fe and Ni is made of $Fe_2O_3$ as the main component and NiO in the remainder. The $Fe_2O_3$ content is preferably in a range from 70 to 95 mol %, with the remainder containing NiO. The remainder also preferably contains at least one selected from ZnO, CuO and $Bi_2O_3$.

(3) The sintered body that contains Fe and Al is made of $Fe_2O_3$ and $Al_2O_3$, of which content being 20 mol % or more for $Fe_2O_3$ and 80 mol % or less for $Al_2O_3$. The content of $Fe_2O_3$ is preferably in a range from 40 to 90 mol %. Besides $Fe_2O_3$ and $Al_2O_3$, the remainder contains at least one selected from ZnO, CuO and $Bi_2O_3$.

(4) The sintered body that contains Fe and Co is made of $Fe_2O_3$ and CoO, of which content being 45 mol % or more for $Fe_2O_3$ and 55 mol % or less for CoO. The content of $Fe_2O_3$ is preferably in a range from 55 to 90 mol %. Besides $Fe_2O_3$ and CoO, the remainder contains at least one selected from ZnO, MnO, NiO, CuO and $Bi_2O_3$.

(5) The electromagnetic wave absorber of the present invention has volume resistivity of preferably $5 \times 10^5$ Ω·m or lower.

A first high-frequency circuit package according to the present invention comprises a package base and a package lid attached to the package base, with the electromagnetic wave absorber described above installed therein.

A second high-frequency circuit package according to the present invention comprises a package base and a package lid attached to the package base, with the package lid being formed from the electromagnetic wave absorber described above.

Objects and advantages of the present invention will become apparent as one reads the detailed described that follows.

Figure 1:
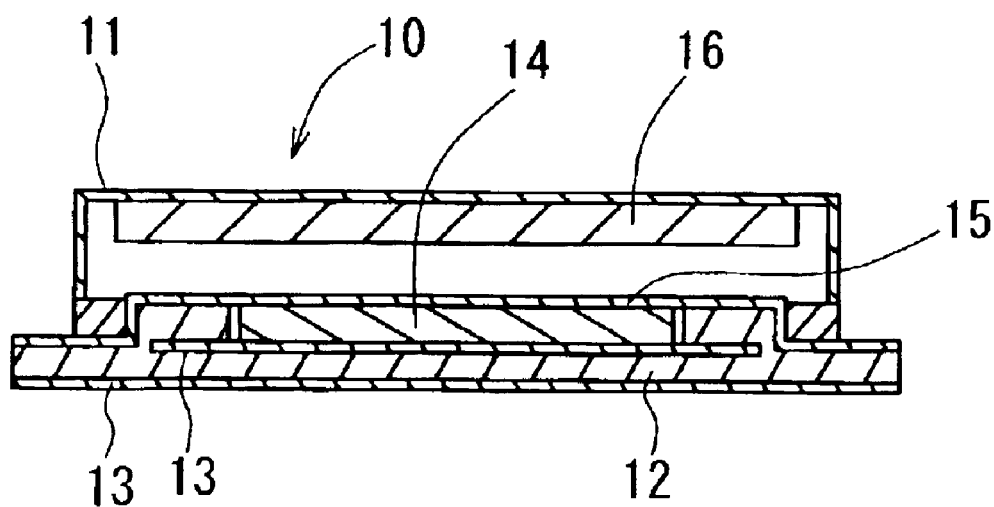
FIG. 1 is a sectional view of a high-frequency circuit package provided with an electromagnetic wave absorber of the present invention.
Figure 2:
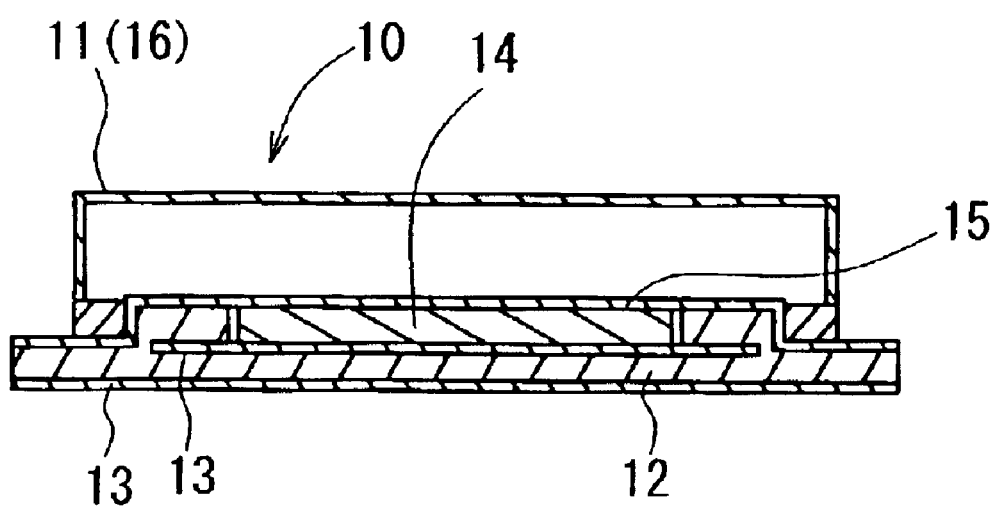
FIG. 2 is a high-frequency circuit package employing the electromagnetic wave absorber of the present invention for a package lid.

DETAILED DESCRIPTION OF THE INVENTION (1) An electromagnetic wave absorber comprising a sintered body containing Fe and at least one element selected from Si, Mg and Zr The electromagnetic wave absorber is made of a sintered body that contains Fe and at least one element selected from Si, Mg and Zr. The content of Fe is 20 to 95 mol % on $Fe_2O_3$ basis, and the content of at least one element selected from Si, Mg and Zr is 5 to 80 mol % in total on $SiO_2$, MgO and/or $ZrO_2$ basis. This electromagnetic wave absorber achieves 2 dB or more of attenuation of electromagnetic wave at frequencies of 10 GHz and higher.

In case the content of at least one element selected from Si, Mg and Zr is less than 5 mol % in total on $SiO_2$, MgO and/or $ZrO_2$ basis, the electromagnetic wave absorber has a high volume resistivity and good electromagnetic wave absorbing characteristic cannot be obtained, while it becomes difficult to sinter at a low temperature. When the content is more than 80 mol %, on the other hand, the electromagnetic wave absorber has a high volume resistivity and good electromagnetic wave absorbing characteristic cannot be obtained.

In case the content of Fe is less than 20 mol % on $Fe_2O_3$ basis, the electromagnetic wave absorber has a high volume resistivity and therefore good electromagnetic wave absorbing characteristic cannot be obtained. When the content is more than 95 mol %, on the other hand, it becomes difficult to sinter unless fired at a significantly high temperature, and good electromagnetic wave absorbing characteristic may not be obtained.

In addition, 1 to 50 mol % of Al is preferably contained on $Al_2O_3$ basis. In case the content of Al is less than 1 mol % on $Al_2O_3$ basis, significant improvement in the electromagnetic wave absorbing characteristic cannot be achieved. When the content of Al is more than 50 mol %, on the other hand, significant improvement in the electromagnetic wave absorbing characteristic cannot be achieved.

The electromagnetic wave absorber preferably contains Fe in a range from 40 to 90 mol % on $Fe_2O_3$ basis. In case the content of Fe is in a range from 20 mol % to 40 mol % on $Fe_2O_3$ basis, although good electromagnetic wave absorbing characteristic can be achieved, even a small change in the content of $Fe_2O_3$ has a significant effect on the electromagnetic wave absorbing characteristic which makes it difficult to design the high-frequency circuit package. When the content of $Fe_2O_3$ is more than 90 mol %, it becomes difficult to sinter unless fired at a significantly high temperature, and good electromagnetic wave absorbing characteristic may not be obtained.

While the $Fe_2O_3$ content of the material to make the electromagnetic wave absorber makes it difficult to sinter as described above, it is made possible to obtain a dense sintered body at a lower temperature by adding at least one element selected from Si, Mg and Zr in proportion of 5 to 80 mol % in total on $SiO_2$, MgO and/or $ZrO_2$ basis. Since 10 dB or higher attenuation of electromagnetic wave can be achieved with the electromagnetic wave absorber depending on the molding pressure and firing temperature, it is preferable to add at least one element selected from Si, Mg and Zr in proportion of 10 to 60 mol % in total on $SiO_2$, MgO and/or $ZrO_2$ basis.

The electromagnetic wave absorber preferably contains one type of crystal (hereinafter referred to as crystal A) selected from MgO. $Fe_2O_3$, fayarite (2FeO. $SiO_2$), magnetite (FeO.), spinel (MgO. $Al_2O_3$), silica, cristobalite, tridymite, $ZrO_2$, MgO, protoenstatite (MgO. $SiO_2$), mullite (3$Al_2O_3$. 2$SiO_2$), forsterite (2MgO. $SiO_2$), zircon ($ZrSiO_4$), cordierite (2MgO. 2$Al_2O_3$. 5$SiO_2$) and steatite (MgO. $SiO_2$). This constitution enables it to suppress the cavity resonance in the high-frequency circuit package and achieve good electromagnetic wave absorbing characteristic. This is supposedly for the reason described below.

The electromagnetic wave absorber of the present invention can be used preferably in a high-frequency circuit package which operates in high-frequency region of 10 GHz and higher. Cavity resonance of electromagnetic wave in the high-frequency circuit package causes coupling of electromagnetic wave with a high-frequency signal transmission line, interference with the transmission of high-frequency signal and generation of undesired radiation. In order to avoid such problems, it is important to decrease the effective permittivity of the inner space of the high-frequency circuit package by containing a crystal that has a low relative permittivity in the electromagnetic wave absorber that is installed in the high-frequency circuit package. The electromagnetic wave absorber of the present invention contains Fe and at least one element selected from Si, Mg and Zr in the proportions described above, and therefore can contain a crystal that has low relative permittivity. In particular, since the crystal A has a low relative permittivity in a range from about 3 to 10 at frequencies above 10 GHz, cavity resonance of electromagnetic wave can be prevented from occurring by installing the electromagnetic wave absorber that contains the crystal A in the high-frequency circuit package.

An electromagnetic wave absorber that contains crystal made of a dielectric material such as $BaTiO_3$, $CaTiO_3$, $SrTiO_3$ and $TiO_3$ or a dielectric material such as $Ba(Zn_{1/3}Ta_{2/3})O_3$, $Ba(Zn_{1/3}Nb_{2/3})O_3$, or $Ba(Mg_{1/3}Ta_{2/3})O_3$ that has relative permittivity of 100 or higher at high frequencies has a high effective dielectric constant. Therefore, use of such an electromagnetic wave absorber in the high-frequency circuit package causes cavity resonance of electromagnetic wave to occur in the high-frequency circuit.

Attenuation of electromagnetic wave is set to 2 dB or more in the frequency region in which an ordinary high-frequency circuit package operates, namely at frequencies of 10 GHz and higher, because cavity resonance cannot be suppressed with attenuation of less than 2 dB.

It is also preferable that volume resistivity that is one of factors having great influence on the electromagnetic wave absorbing characteristic is set to $5 \times 10^5$ Ω·m or less. When the volume resistivity is $5 \times 10^5$ Ω·m or less, it is made easier to achieve attenuation of 2 dB or higher at frequencies of 10 GHz and higher.

Good electromagnetic wave absorbing characteristic can be achieved and cavity resonance can be suppressed by, for example, using the electromagnetic wave absorber 16 of the present invention in the high-frequency circuit package 10 that comprises a package base 12, that has a high-frequency circuit board 14 with a semiconductor device (not shown) mounted thereon and a transmission line 15 formed on the surface thereof, and a package lid 11 attached onto the package base 12 as shown in FIG. 1.

It is important that the electromagnetic wave absorber 16 does not contain compounds that contain Br, Cl or S. When the electromagnetic wave absorber 16 contains a compound that contains Br, Cl or S, the semiconductor device (not shown), the transmission line 15 and other components are subject to corrosion when the electromagnetic wave absorber 16 is installed in the high-frequency circuit package 10. Since the electromagnetic wave absorber 16 of the present invention is made of a ferrite-based ceramic material that does not essentially contain a compound that contains Br, Cl or S, the semiconductor device (not shown), the transmission line 15 and other components will not be corroded.

The electromagnetic wave absorber 16 of the present invention may contain metal elements such as Ca, Co, Cu and Mn as inevitable impurities in a concentration of 500 ppm or less, which do not cause corrosion of the semiconductor device (not shown), the transmission line 15 and other components and cause no problem.

The electromagnetic wave absorber of the present invention is fabricated, for example, by a method as described below. First, a stock material of at least one selected from $SiO_2$, MgO and $ZrO_2$ in the form of powder in a proportion of 5 to 80 mol % in total is mixed with 20 to 95 mol % of $Fe_2O_3$ powder and water in a ball mill or beads mill. Slurry having a predetermined particle size distribution is obtained in a wet mixing process carried out for at least six hours.

When mixing the powders of $Fe_2O_3$, $SiO_2$, MgO and/or $ZrO_2$ in the ball mill or beads mill, a small amount of known curing agents, auxiliary curing agents, lubricants, plasticizers, dispersants, mold release agents, coloring agents and/or bulking agents (inorganic substances) may be added.

Mean particle size of the powder contained in the slurry obtained by wet mixing is preferably not larger than 1 μm and more preferably not larger than 0.85 μm, in order to obtain satisfactorily sintered body.

The slurry is then dried and granulated by using a spray drier, with the granulated powder being formed into a green body of desired shape by a proper molding method such as pressure powder molding process.

Alternatively, the slurry that has been dried may be calcined at a temperature from 800 to 1100° C., with the calcined material being crushed in a ball mill, beads mill or the like and dried again with a spray drier, with the granulated powder being formed into a green body of desired shape by a proper molding method such as pressure powder molding process. When the pressure powder molding is employed, the molding pressure may be, for example, in a range from 460 to 1900 MPa.

After firing the green body at a temperature from 1400 to 1600° C. for a period of time up to five hours, the temperature is decreased at a rate of 300 to 500° C./hour and the electromagnetic wave absorber of the present invention is obtained. In order to obtain an electromagnetic wave absorber having volume resistivity of $5 \times 10^5$ Ω·m or less, the molding pressure may be set to 934 MPa or higher or the firing temperature may be set to 1500° C. or higher in the manufacturing process described above.

When a thin electromagnetic wave absorber is desired, the sintered body may be subjected to a process such as grinding or polishing.

The shape of the electromagnetic wave absorber obtained as described above is not limited to rectangular parallelepiped, and maybe cylinder, cone, prism, triangular pyramid, or a combination of the former, and void may also be contained in the electromagnetic wave absorber. The electromagnetic wave absorber may be installed anywhere in the high-frequency circuit package as long as the performance of the high-frequency circuit package is not affected and cavity resonance can be suppressed.

When installing the electromagnetic wave absorber 16 of the present invention in the high-frequency circuit package 10, the electromagnetic wave absorber may be fastened onto the package lid 11 by means of solder or a known thermosetting resin adhesive. When a thermosetting resin adhesive is used, an epoxy resin is preferably used.

It is important that the solder or the thermosetting resin adhesive does not contain a compound that contains Br, Cl or S. This is because, as mentioned previously, a compound of Br, Cl or S, if contained in the material, corrodes the semiconductor device (not shown), the transmission line 15 and other components.

In case the electromagnetic wave absorber 16 is fastened onto the package lid 11 using the thermosetting resin adhesive (hereinafter referred to simply as adhesive), the adhesive preferably becomes a material having Young's modulus of 10 GPa, more preferably 5 GPa or less after being hardened. This is because the material of the package lid 11 usually has a linear expansion coefficient different from that of the electromagnetic wave absorber 16 and, when the hardened adhesive has Young's modulus higher than 10 GPa, stress generated in the electromagnetic wave absorber 16 cannot be sufficiently relieved and the high-frequency circuit package 10 may be broken.

To meet the requirement described above, an epoxy resin is preferable and, particularly, epoxy resin of bisphenol A type is preferably used.

The electromagnetic wave absorber 16 is bonded onto the package lid 11, after applying the adhesive by printing or coating onto the electromagnetic wave absorber 16 or the package lid 11, by bringing the electromagnetic wave absorber 16 and the package lid 11 into contact with each other and applying heat treatment at a predetermined temperature.

It is preferable that the electromagnetic wave absorber 16 contains open pores. If there are open pores on the surface that is in contact with the package lid 11, the adhesive enters the open pores of the electromagnetic wave absorber 16 when bonding the electromagnetic wave absorber 16 and package lid 11, thereby increasing the bonding strength. Since there are voids and pores in the electromagnetic wave absorber 16, open pores can be formed by grinding the surface. In order to form satisfactory open pores, void ratio in the electromagnetic wave absorber 16 is preferably in a range from 2% to 15%.

In addition to the effect of suppressing the generation of undesirable electromagnetic wave by cavity resonance and/or a semiconductor device in the high-frequency circuit package 10, the electromagnetic wave absorber 16 has the effect of making the high-frequency circuit package 10 of higher reliability since a corrosive gas is not evolved from the electromagnetic wave absorber and the adhesive.

In another embodiment of the present invention, the package lid 11 may be formed from the electromagnetic wave absorber 16 of the present invention in the high-frequency circuit package 10 comprising the package base 12 and the package lid 11 attached onto the package base 12. With this constitution, not only the generation of undesirable electromagnetic wave by cavity resonance and/or a semiconductor device can be suppressed, but also the number of component parts can be reduced and a process of attaching the electromagnetic wave absorber can be eliminated, thereby cutting down the manufacturing cost.

Inner cavity of the high-frequency circuit package of the present invention has a volume preferably in a range from 0.005 to 10 mm$^2$, and more preferably from 0.02 to 5 mm$^2$, in order to suppress the cavity resonance at frequencies of particularly 10 GHz and higher.

When the package lid 11 is formed from the electromagnetic wave absorber 16 of the present invention, the electromagnetic wave absorber 16 is preferably made of a dense sintered body having void ratio of not higher than 2%, so as to provide the function of the package lid.

The electromagnetic wave absorber of the present invention provides satisfactory electromagnetic wave absorbing characteristic also when used in an optical communication device equipped with an electro-optic converter.

According to this embodiment, as described in detail above, the electromagnetic wave absorber can be sintered at a low temperature and good electromagnetic wave absorbing characteristic can be obtained, by using a sintered body that contains Fe and at least one element selected from Si, Mg and Zr, of which contents being in a range from 20 to 95 mol % on $Fe_2O_3$ basis, and from 5 to 80 mol % in total on $SiO_2$, MgO and/or $ZrO_2$ basis, respectively, and setting the attenuation of electromagnetic wave to 2 dB or more at frequencies of 10 GHz and higher.

When the $Fe_2O_3$ content in the electromagnetic wave absorber is set in a range from 40 to 90 mol %, satisfactory electromagnetic wave absorbing characteristic can be obtained and, in case the electromagnetic wave absorber is used in the high-frequency circuit package, degree of freedom in the design of the high-frequency circuit package can be increased.

Attenuation of electromagnetic wave by 2 dB or more at frequencies of 10 GHz and higher can be easily achieved by setting the volume resistivity of the electromagnetic wave absorber to $5 \times 10^5$ Ω·m or less.

Good electromagnetic wave absorbing characteristic can be achieved and cavity resonance can be suppressed by installing the electromagnetic wave absorber in the high-frequency circuit package that comprises the package base and the package lid attached onto the package base.

When the package lid is formed from the electromagnetic wave absorber in the high-frequency circuit package comprising the package base and the package lid attached onto the package base, the number of component parts can be reduced and a process of attaching the electromagnetic wave absorber can be eliminated, thereby cutting down the manufacturing cost.

(2) Electromagnetic wave absorber comprising a sintered body containing Fe and Ni This electromagnetic wave absorber is made of a sintered body containing $Fe_2O_3$ as the main component and the remainder containing NiO, and achieves attenuation of 2 dB or more for electromagnetic wave at frequencies of 10 GHz and higher.

$Fe_2O_3$ is used as the main component, namely contained in proportion of 50 mol % or higher, because volume resistivity of the electromagnetic wave absorber becomes higher when the content is less than 50 mol % thus making it impossible to obtain good electromagnetic wave absorbing characteristic.

The content of $Fe_2O_3$ is more preferably in a range from 70 to 95 mol %. In case the content of $Fe_2O_3$ is 50 mol % or more and less than 70 mol %, although good electromagnetic wave absorbing characteristic can be achieved, even a small change in the content of $Fe_2O_3$ has a significant effect on the electromagnetic wave absorbing characteristic which makes it difficult to design the high-frequency circuit package. When the content of $Fe_2O_3$ is more than 95 mol %, on the other hand, it becomes difficult to sinter depending on the molding pressure, and good electromagnetic wave absorbing characteristic may not be obtained.

NiO is contained in the remainder because the electromagnetic wave absorber that does not include NiO at all has a high volume resistivity and, as a result, good electromagnetic wave absorbing characteristic cannot be obtained and it becomes difficult to sinter at a low temperature. Although it tends to become difficult to sinter the electromagnetic wave absorber of the present invention as the content of $Fe_2O_3$ is increased as described above, adding a predetermined amount of NiO thereto enables it to obtain a dense sintered body at a low temperature. Since 10 dB or higher attenuation of electromagnetic wave can be achieved by the electromagnetic wave absorber depending on the molding pressure and the firing temperature, it is preferable to contain 10 to 30 mol % of NiO in the electromagnetic wave absorber.

Requirement for the attenuation of electromagnetic wave is set to 2 dB or more in the frequency region in which an ordinary high-frequency circuit package operates, namely at frequencies of 10 GHz and higher, because cavity resonance cannot be suppressed with an attenuation of less than 2 dB.

The remainder of the electromagnetic wave absorber preferably contains at least one of ZnO, CuO and $Bi_2O_3$, which makes it possible to sinter with a molding pressure as low as about 460 MPa to make the electromagnetic wave absorber. The content of ZnO, CuO and $Bi_2O_3$ is preferably not less than 1 mol % of the electromagnetic wave absorber in order to achieve $10^4$ Ω·m or lower volume resistivity of the electromagnetic wave absorber. The content of ZnO, CuO and $Bi_2O_3$ is also preferably not higher than 25 mol % of the electromagnetic wave absorber. When it is higher than 25 mol %, temperature range in which the material can be sintered becomes very small, thus making it unsuitable for mass production.

It is also preferable that volume resistivity that is one of factors having great influence on the electromagnetic wave absorbing characteristic is set to $5 \times 10^5$ Ω·m or less. When the volume resistivity is $5 \times 10^5$ Ω·m or less, it is made easier to achieve an attenuation of 2 dB or higher at frequencies of 10 GHz and higher.

The electromagnetic wave absorber 16 of the present invention may contain $SiO_2$ and metal elements such as Ca, Al, Co, Cu and Mn as inevitable impurities in a concentration of several hundreds of parts per million, since this level of concentration does not corrode the semiconductor device (not shown), the transmission line 15 and other components and causes no problem.

The electromagnetic wave absorber is fabricated by a method as described below. First, stock materials of not less than 50 mol % of $Fe_2O_3$ powder and NiO powder are mixed with water in a ball mill or beads mill. Slurry having a predetermined viscosity is obtained in a wet mixing process carried out for a period from six to ten hours.

When mixing the powders of $Fe_2O_3$ and NiO powders in the ball mill or beads mill, a small amount of known curing agents, auxiliary curing agents, lubricants, plasticizers, dispersants, mold release agents, coloring agents and/or bulking agents (inorganic substances) may be added.

Mean particle sizes of the powders of $Fe_2O_3$ and NiO are preferably not larger than 1 μm and more preferably not larger than 0.85 μm, in order to obtain satisfactorily sintered body.

Moreover, in order to enable molding at a lower pressure, it is preferable to add powder material of at least one of ZnO, CuO and $Bi_2O_3$, and total amount thereof is preferably in a range from 5 to 10 mol %, which enables it to reduce the equipment cost for the molding process and make the electromagnetic wave absorber having a complicated shape.

The slurry is then dried and granulated by using a spray drier, with the granulated powder being formed into a green body of desired shape by a proper molding method such as the pressure powder molding process.

Alternatively, the slurry that has been dried may be calcined at a temperature from 700 to 900° C., with the calcined material being crushed in a ball mill or beads mill and dried again with the spray drier, with the dried material being formed into a green body of desired shape by a proper molding method such as the pressure powder molding process.

When the pressure powder molding process is employed, the molding pressure may be, for example, in a range from 460 to 1900 MPa. After firing the green body at a temperature from 1000 to 1400° C. for a period of time up to two hours, the temperature is decreased at a rate of 300 to 500° C./hour and the electromagnetic wave absorber of the present invention is obtained.

In order to obtain an electromagnetic wave absorber having volume resistivity of $5 \times 10^5$ Ω·m or less, the molding pressure may be set to 934 MPa or higher or the firing temperature may be set to 1200° C. or higher in the manufacturing process described above.

According to this embodiment, as described in detail above, the electromagnetic wave absorber can be sintered at a low temperature and good electromagnetic wave absorbing characteristic can be obtained, by using a sintered body that contains $Fe_2O_3$ as the major component with the remainder containing NiO and setting the attenuation of electromagnetic wave to 2 dB or more at frequencies of 10 GHz and higher.

When the $Fe_2O_3$ content in the electromagnetic wave absorber is set in a range from 70 to 95 mol %, satisfactory electromagnetic wave absorbing characteristic can be obtained and, in case the electromagnetic wave absorber is used in the high-frequency circuit package, degree of freedom in the design of the high-frequency circuit package can be increased.

By making the electromagnetic wave absorber containing at least one of ZnO, CuO and $Bi_2O_3$, the sintering process can be stabilized regardless of the molding pressure, equipment cost for the molding process can be reduced and the electromagnetic wave absorber having a complicated shape can be made.

Attenuation of for electromagnetic wave by 2 dB or more at frequencies of 10 GHz and higher can be easily achieved by setting the volume resistivity of the electromagnetic wave absorber to $5 \times 10^5$ Ω·m or less.

Good electromagnetic wave absorbing characteristic can be achieved and cavity resonance can be suppressed by installing the electromagnetic wave absorber in the high-frequency circuit package that comprises the package base and the package lid attached onto the package base.

When the package lid is formed from the electromagnetic wave absorber described above in the high-frequency circuit package comprising the package base and the package lid attached onto the package base, the number of component parts can be reduced and a process of attaching the electromagnetic wave absorber can be eliminated, thereby cutting down the manufacturing cost.

For other respect, this electromagnetic wave absorber has features similar to those of that described in (1).

(3) An electromagnetic wave absorber comprising a sintered body containing Fe and Al The electromagnetic wave absorber is made of a sintered body that contains $Fe_2O_3$ and $Al_2O_3$, of which contents being 20 mol % or more for $Fe_2O_3$ and 80 mol % or less for $Al_2O_3$, and achieves 2 dB or more attenuation of electromagnetic wave at frequencies of 10 GHz and higher.

When the content of $Fe_2O_3$ is less than 20 mol %, volume resistivity of the electromagnetic wave absorber becomes higher thus making it impossible to obtain good electromagnetic wave absorbing characteristic. The content of $Fe_2O_3$ is preferably in a range from 40 to 90 mol %.

In case the content of $Fe_2O_3$ is in a range from 20 mol % to 40 mol %, although good electromagnetic wave absorbing characteristic can be achieved, even a small change in the content of $Fe_2O_3$ has a significant effect on the electromagnetic wave absorbing characteristic which may make it difficult to design the high-frequency circuit package. When the content of $Fe_2O_3$ is more than 90mol %, on the other hand, it becomes difficult to sinter unless the firing temperature is significantly high, and good electromagnetic wave absorbing characteristic may not be obtained.

$Al_2O_3$ is contained in the remainder because the electromagnetic wave absorber that does not contain $Al_2O_3$ at all has a high volume resistivity and, as a result, good electromagnetic wave absorbing characteristic cannot be obtained and it becomes difficult to sinter at a low temperature. Although it tends to become difficult to sinter the electromagnetic wave absorber of the present invention as $Fe_2O_3$ is contained as described above, adding a predetermined amount of $Al_2O_3$ therein enables it to obtain a dense sintered body at a low temperature. Since an attenuation of electromagnetic wave as high as 10 dB or more can be achieved depending on the molding pressure and the firing temperature for the electromagnetic wave absorber, it is preferable to contain 10 to 60 mol % of $Al_2O_3$ in the electromagnetic wave absorber.

Requirement for the attenuation of electromagnetic wave is set to 2 dB or more in the frequency region in which an ordinary high-frequency circuit package operates, namely at frequencies of 10 GHz and higher, because cavity resonance cannot be suppressed with an attenuation of less than 2 dB.

The remainder of the electromagnetic wave absorber other than $Fe_2O_3$ and $Al_2O_3$ preferably contains at least one of ZnO, CuO and $Bi_2O_3$, which makes it possible to sinter with a low molding pressure of about 460 MPa at a firing temperature of 1400° C. to make the electromagnetic wave absorber. The content of ZnO, CuO and $Bi_2O_3$ is preferably 1 mol % or more of the electromagnetic wave absorber in order to achieve $10^4$ Ω·m or lower volume resistivity of the electromagnetic wave absorber. The content of ZnO, CuO and $Bi_2O_3$ is also preferably not higher than 25 mol % of the electromagnetic wave absorber. When it is higher than 25 mol %, temperature range in which the material can be sintered becomes very small, thus making it unsuitable for mass production.

It is also preferable that volume resistivity that is one of factors having great influence on the electromagnetic wave absorbing characteristic is set to $5\times10^5$ Ω·m or less. When the volume resistivity is $5\times10^5$ Ω·m or less, it is made easier to achieve attenuation of 2 dB or higher at frequencies of 10 GHz and higher.

The electromagnetic wave absorber 16 of the present invention may contain $SiO_2$ and metal elements such as Ca, Al, Co, Cu and Mn as inevitable impurities in a concentration of several hundreds of parts per million, since this level of concentration does not corrode the semiconductor device (not shown), the transmission line 15 and other components and causes no problem.

The electromagnetic wave absorber of the present invention is fabricated by a method as described below. First, stock materials of not less than 20 mol % of $Fe_2O_3$ and $Al_2O_3$ in the form of powder are mixed with water in a ball mill or beads mill. Slurry having a predetermined viscosity is obtained in a wet mixing process carried out for a period of at least six hours.

When mixing the powders of $Fe_2O_3$ and $Al_2O_3$ in the ball mill or beads mill, a small amount of known curing agents, auxiliary curing agents, lubricants, plasticizers, dispersants, mold release agents, coloring agents and/or bulking agents (inorganic substances) may be added.

Mean particle sizes of the powders of $Fe_2O_3$ and $Al_2O_3$ that have been mixed in the wet process are preferably not larger than 1 μm and more preferably not larger than 0.85 μm, in order to obtain satisfactorily sintered body.

Moreover, in order to enable molding at a lower pressure, it is referable to add powder material of at least one of ZnO, CuO and $Bi_2O_3$, and total amount of the added material is preferably in a range from 5 to 10 mol %, which enables it to reduce the equipment cost for the molding process and make the electromagnetic wave absorber having a complicated shape.

The slurry is then dried and granulated by using a spray drier, with the granulated powder being formed into a green body of desired shape by a proper molding method such as the pressure powder molding process.

Alternatively, the slurry that has been dried may also be calcined at a temperature from 800 to 1100° C., with the calcined material being crushed in a ball mill or beads mill and dried again with the spray drier, with the dried powder being formed into a green body of desired shape by a proper molding method such as the pressure powder molding process.

When the pressure powder molding process is employed, the molding pressure may be, for example, in a range from 460 to 1900 MPa. After firing the green body at a temperature from 1400 to 1600° C. for a period of time up to two hours, the temperature is decreased at a rate of 300 to 500° C./hour and the electromagnetic wave absorber of the present invention is obtained.

In order to obtain an electromagnetic wave absorber having volume resistivity of $5\times10^5$ Ω·m or less, the molding pressure may be set to 934 MPa or higher or the firing temperature may be set to 1500° C. or higher.

According to this embodiment, as described in detail above, the electromagnetic wave absorber can be sintered at a low temperature and good electromagnetic wave absorbing characteristic can be obtained, by using a sintered body that contains $Fe_2O_3$ and $Al_2O_3$ of which contents being 20 mol % or more for $Fe_2O_3$ and 80 mol % or less for $Al_2O_3$, and setting the attenuation of electromagnetic wave to 2 dB or more at frequencies of 10 GHz and higher.

When the $Fe_2O_3$ content in the electromagnetic wave absorber is set in a range from 40 to 50 mol %, satisfactory electromagnetic wave absorbing characteristic can be obtained and, in case the electromagnetic wave absorber is used in the high-frequency circuit package, degree of freedom in the design of the high-frequency circuit package can be increased.

By making the electromagnetic wave absorber containing at least one of ZnO, CuO and $Bi_2O_3$ in the remainder other than $Fe_2O_3$ and $Al_2O_3$, the sintering process can be stabilized regardless of the molding pressure, equipment cost for the molding process can be reduced and the electromagnetic wave absorber having a complicated shape can be made.

Attenuation of electromagnetic wave by 2 dB or more at frequencies of 10 GHz and higher can be easily achieved by setting the volume resistivity of the electromagnetic wave absorber to $5\times10^5$ Ω·m or less.

Good electromagnetic wave absorbing characteristic can be achieved and cavity resonance can be suppressed by installing the electromagnetic wave absorber described above in the high-frequency circuit package that comprises the package base and the package lid attached onto the package base.

When the package lid is formed from the electromagnetic wave absorber described above in the high-frequency circuit package comprising the package base and the package lid attached onto the package base, the number of component parts can be reduced and a process of attaching the electromagnetic wave absorber can be eliminated, thereby cutting down the manufacturing cost.

For other respect, this electromagnetic wave absorber has features similar to those of that described in (1).

(4) An electromagnetic wave absorber comprising a sintered body containing Fe and Co The electromagnetic wave absorber is made of a sintered body that contains $Fe_2O_3$ and CoO, of which content being 45 mol % or more for $Fe_2O_3$ and 55 mol % or less for CoO, and achieves an attenuation of electromagnetic wave by 2 dB or more at frequencies of 10 GHz and higher.

When the content of $Fe_2O_3$ is less than 45 mol % and content of CoO is more than 55 mol %, volume resistivity of the electromagnetic wave absorber becomes higher thus making it impossible to obtain good electromagnetic wave absorbing characteristic.

The content of $Fe_2O_3$ in the electromagnetic wave absorber of the present invention is preferably in a range from 55 to 90 mol %. In case the content of $Fe_2O_3$ is 45 mol % or higher and less than 55 mol %, then the attenuation of electromagnetic wave varies significantly with the frequency of operation, thus making it difficult to design the high-frequency circuit package. When the content of $Fe_2O_3$ is more than 90 mol %, on the other hand, content of CoO may become as small as a mere impurity. Thus it becomes difficult to obtain a dense sintered body of cobalt ferrite, and good electromagnetic wave absorbing characteristic may not be obtained.

An electromagnetic wave absorber that does not contain CoO at all has a high volume resistivity, which makes it impossible to achieve good electromagnetic wave absorbing characteristic and it becomes difficult to sinter at a low temperature. Although it is difficult to sinter the electromagnetic wave absorber of the present invention because $Fe_2O_3$ is contained as described above, adding a predetermined amount of CoO thereto enables it to obtain a dense sintered body at a low temperature. Since 10 dB or higher attenuation of electromagnetic wave can be achieved by the electromagnetic wave absorber depending on the molding pressure and the firing temperature, it is preferable to contain 10 to 45 mol % of CoO in the electromagnetic wave absorber.

Requirement for the attenuation of electromagnetic wave is set to 2 dB or more in the frequency region in which an ordinary high-frequency circuit package operates, namely at frequencies of 10 GHz and higher, because cavity resonance cannot be suppressed with an attenuation of less than 2 dB.

The remainder of the electromagnetic wave absorber other than $Fe_2O_3$ and CoO preferably contains at least one of ZnO, MnO, NiO, CuO and $Bi_2O_3$, which makes it possible to sinter with a low molding pressure of about 460 MPa at a firing temperature of 1100° C. to make the electromagnetic wave absorber. The content of ZnO, MnO, NiO, CuO or $Bi_2O_3$ is preferably 0.3 mol % or more of the electromagnetic wave absorber in order to achieve $10^6$ Ω·m or lower volume resistivity of the electromagnetic wave absorber. The content of ZnO, MnO, NiO, CuO or $Bi_2O_3$ is also preferably not higher than 10 mol % of the electromagnetic wave absorber. When it is higher than 10 mol %, temperature range in which the material can be sintered becomes very small, thus making it unsuitable for mass production.

It is also preferable that volume resistivity that is one of factors having great influence on the electromagnetic wave absorbing characteristic is set to $5 \times 10^5$ Ω·m or less. This is because, when the volume resistivity is $5 \times 10^5$ Ω·m or less, it is made easier to attenuate the electromagnetic wave by 2 dB or more at frequencies of 10 GHz and higher.

The electromagnetic wave absorber 16 of the present invention may contain $SiO_2$ and metal elements such as Ca, Al, Co, Cu and Mn as inevitable impurities in a concentration of several hundreds of parts per million, since such a low level of concentration does not corrode the semiconductor device (not shown), the transmission line 15 and other components and causes no problem.

The electromagnetic wave absorber is fabricated by a method as described below. First, stock materials of not less than 45 mol % of $Fe_2O_3$ and CoO in the form of powder are mixed with water in a ball mill or beads mill. Slurry having a predetermined viscosity is obtained in a wet mixing process carried out for a period of at least six hours.

When mixing the powders of $Fe_2O_3$ and CoO in the ball mill or beads mill, a small amount of known curing agents, auxiliary curing agents, lubricants, plasticizers, dispersants, mold release agents, coloring agents and/or bulking agents (inorganic substances) may be added.

Mean particle sizes of the powders of $Fe_2O_3$ and CoO that have been mixed in the wet process are preferably not larger than 1 μm and more preferably not larger than 0.85 μm, in order to obtain satisfactorily sintered body.

Moreover, in order to enable molding at a lower pressure, it is preferable to add powder material of at least one of ZnO, MnO, NiO, CuO and $Bi_2O_3$, and total amount thereof is preferably in a range from 5 to 10 mol %, which enables it to reduce the equipment cost for the molding process and make the electromagnetic wave absorber in a complicated shape.

The slurry is then dried and granulated by using a spray drier, with the granulated powder being formed into a green body of desired shape by a proper molding method such as the pressure powder molding process.

Alternatively, the slurry that has been dried may also be calcined at a temperature from 700 to 1000° C., with the calcined material being crushed in a ball mill or beads mill and dried again with the spray drier, with the dried powder being formed into a green body of desired shape by a proper molding method such as the pressure powder molding process.

When the pressure powder molding process is employed, the molding pressure may be, for example, in a range from 460 to 1900 MPa. After firing the green body at a temperature from 1100 to 1300° C. for a period of time up to two hours, the temperature is decreased at a rate of 300 to 500° C./hour and the electromagnetic wave absorber of the present invention is obtained.

In order to obtain an electromagnetic wave absorber having volume resistivity of $5 \times 10^5$ Ω·m or less, the molding pressure may be set to 1400 MPa or higher and the firing temperature in a range from 1150 to 1300° C., with the contents of $Fe_2O_3$ and CoO being set in a range from 55 to 90 mol % and from 10 to 45 mol %, respectively.

According to this embodiment, as described in detail above, the electromagnetic wave absorber can achieve good electromagnetic wave absorbing characteristic, by using a sintered body that contains $Fe_2O_3$ and CoO, of which contents being 45 mol % or more for $Fe_2O_3$ and 55 mol % or less for CoO, and setting the attenuation of electromagnetic wave to 2 dB or more at frequencies of 10 GHz and higher.

When the content of $Fe_2O_3$ in the electromagnetic wave absorber is set in a range from 55 to 90 mol %, satisfactory electromagnetic wave absorbing characteristic can be obtained and, in case the electromagnetic wave absorber is used in the high-frequency circuit package, degree of freedom in the design of the high-frequency circuit package can be increased.

By making the electromagnetic wave absorber containing at least one of ZnO, MnO, NiO, CuO and $Bi_2O_3$ in the remainder other than $Fe_2O_3$ and CoO, the sintering process can be stabilized regardless of the molding pressure, equipment cost for the molding process can be reduced and the electromagnetic wave absorber having a complicated shape can be made.

Attenuation of electromagnetic wave by 2 dB or more at frequencies of 10 GHz and higher can be easily achieved by setting the volume resistivity of the electromagnetic wave absorber to $5 \times 10^5$ Ω·m or less.

Good electromagnetic wave absorbing characteristic can be achieved and cavity resonance can be suppressed by installing the electromagnetic wave absorber described above in the high-frequency circuit package that comprises the package base and the package lid attached onto the package base.

When the package lid is formed from the electromagnetic wave absorber described above in the high-frequency circuit package that comprises the package base and the package lid attached onto the package base, the number of component parts can be reduced and a process of attaching the electromagnetic wave absorber can be eliminated, thereby cutting down the manufacturing cost.

For other respect, this electromagnetic wave absorber has features similar to those of that described in (1).

The electromagnetic wave absorber that contains oxides of Si, Mg, Zr, Ni, Al and/or Co has been described, but similar effects can be achieved when the electromagnetic wave absorber contains, besides such oxides, at least one of CuO and $Bi_2O_3$.

EXAMPLES

Examples of the present invention will be described below, but it is understood that the present invention is not limited by the following examples.

Example 1

Powders of $SiO_2$, MgO, $ZrO_2$, $Al_2O_3$ and $Fe_2O_3$ weighed in the proportions shown in Table 1 were used as starting materials. Slurry having a predetermined viscosity was obtained in a wet mixing process in a ball mill carried out for eight hours. The slurry was then dried and granulated using a spray drier, and the granulated powder was molded under the molding pressures shown in Table 1 in the pressure powder molding process thereby to obtain green bodies.

The green bodies were fired under the firing conditions shown in Table 1, and the electromagnetic wave absorber 16 measuring 3 mm×7 mm×0.4 mm and an evaluation sample measuring 20 mm in outer diameter and 2 mm in thickness were made.

Attenuation of electromagnetic wave achieved by installing the electromagnetic wave absorber 16 and volume resistivity of the evaluation sample were measured, and the effect of the electromagnetic wave absorber 16 in suppressing resonance was evaluated.

Attenuation of electromagnetic wave achieved by installing the electromagnetic wave absorber 16 was measured as follows.

Figure 3:
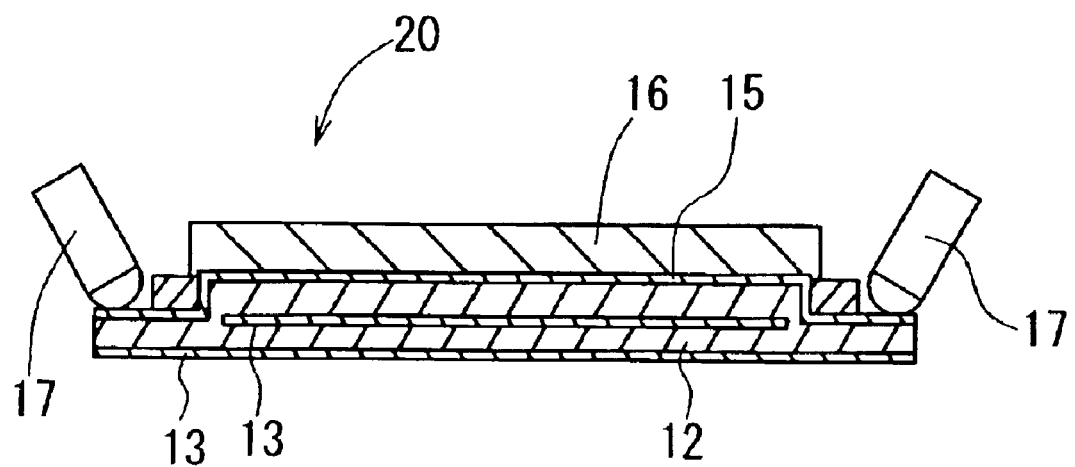
FIG. 3 is a sectional view of an apparatus used to measure electromagnetic attenuation achieved by installing the electromagnetic wave absorber of the present invention.

First, the electromagnetic wave absorber 16 was placed on the package base 12 having the transmission line 15 formed thereon, so as to cover the transmission line 15 as shown in FIG. 3. Dimensions of the package base 12 were 10 mm×10 mm×0.5 mm. Then with a probe 17 pressed against the transmission line 15, power reflection coefficient $S_{11}$ and power transmission coefficient $S_{21}$ were measured in a frequency region from 10 to 40 GHz using a network analyzer (not shown) that is connected to the probe 17 via a coaxial cable (not shown). Attenuation of electromagnetic wave achieved by installing the electromagnetic wave absorber 16 was calculated by substituting the values of power reflection coefficient $S_{11}$ and power transmission coefficient $S_{21}$ in the following formula.

$$\text{Attenuation (dB)} = |S_{21}/(1-S_{11})|$$

Figure 4:
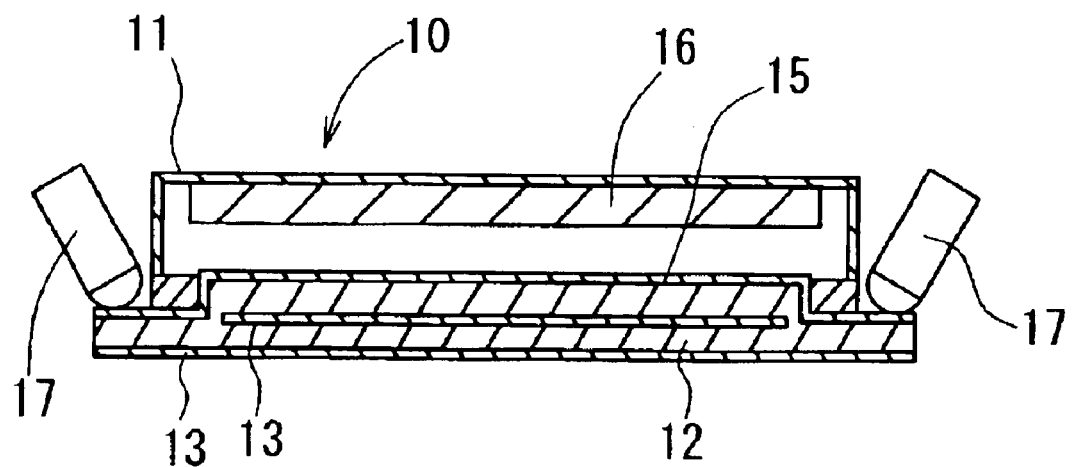
FIG. 4 is a sectional view of an apparatus used to evaluate the effect of suppressing the resonance in the high-frequency circuit package employing the electromagnetic wave absorber of the present invention.

The package base 12 shown in FIG. 3 that was used in the test had power transmission coefficient $S_{21}$ of −1.5 dB or higher. The effect of the electromagnetic wave absorber 16 in suppressing resonance was evaluated by using the high-frequency circuit package 10 comprising the package base 12 having the transmission line 15 formed thereon and the package lid 11 that was made of Kovar (KOV) plated with Au having a cavity measuring 8 mm×8 mm×0.8 mm and was mounted on the package base 12, as shown in FIG. 4. The electromagnetic wave absorber 16 was bonded in the package lid 12 with a low-melting point solder before attaching the package lid 11 onto the package base 12.

The effect of the electromagnetic wave absorber 16 in suppressing resonance was evaluated as follows. With the probe 17 being pressed against the transmission line 15, power transmission coefficient $S_{21}$ was measured in the frequency region from 10 to 40 GHz using the network analyzer (not shown) connected to the probe 17 via the coaxial cable (not shown), and difference between this measurement and power transmission coefficient $S_{21(o)}$ of a case in which the electromagnetic wave absorber 16 was not installed was taken. The effect of suppressing resonance was evaluated as good (○) when the absolute value of the difference $\Delta S_{21}$ was less than 0.1 dB, and ineffective (X) when the absolute value of the difference $\Delta S_{21}$ was 0.1 dB or more.

Volume resistivity of the evaluation sample was measured according to JIS C2141 (1992) except for the shape.

Values of attenuation of electromagnetic wave at frequencies of 10, 20 and 40 GHz, volume resistivity and the results of evaluating the effect of suppressing resonance in the frequency region from 10 to 40 GHz are shown in Table 1.

TABLE 1

| No. | $Fe_2O_3$ (mol %) | $SiO_2$ (mol %) | MgO (mol %) | $ZrO_2$ (mol %) | $Al_2O_3$ (mol %) | Molding Pressure (MPa) | Firing Temperature (° C.) | Firing Time (hrs.) | Attenuation 10 GHz (dB) | Attenuation 20 GHz (dB) | Attenuation 40 GHz (dB) | Volume Resistivity (Ω · m) | Evolution of Suppressing Resonance |
|---|---|---|---|---|---|---|---|---|---|---|---|---|---|
| *1 | 10 | 5 | 0 | 5 | 80 | 1400 | 1400 | 2 | 0.3 | 0.5 | 0.5 | $4.9 \times 10^{11}$ | x |
| *2 | 10 | 40 | 20 | 30 | 0 | 1400 | 1500 | 2 | 1.2 | 1.4 | 1.5 | $4.0 \times 10^{10}$ | x |
| *3 | 10 | 30 | 30 | 30 | 0 | 1400 | 1550 | 2 | 0.7 | 0.9 | 0.8 | $4.2 \times 10^{10}$ | x |
| *4 | 10 | 40 | 40 | 10 | 0 | 1400 | 1600 | 2 | 0.8 | 1.6 | 1.5 | $7.3 \times 10^9$ | x |
| 5 | 20 | 80 | 0 | 0 | 0 | 1400 | 1500 | 2 | 3.0 | 4.1 | 10.5 | $4.5 \times 10^2$ | ○ |
| 6 | 20 | 0 | 30 | 0 | 50 | 1400 | 1550 | 2 | 4.1 | 4.4 | 13.3 | $4.2 \times 10^2$ | ○ |
| 7 | 20 | 37 | 0 | 41 | 2 | 1400 | 1600 | 2 | 2.6 | 4.2 | 13.5 | $3.0 \times 10^2$ | ○ |
| 8 | 30 | 35 | 35 | 0 | 0 | 1400 | 1500 | 2 | 3.2 | 3.4 | 15.3 | $1.4 \times 10^3$ | ○ |
| 9 | 30 | 35 | 0 | 35 | 0 | 1400 | 1550 | 2 | 3.4 | 3.8 | 13.8 | $4.7 \times 10^2$ | ○ |
| 10 | 30 | 0 | 10 | 60 | 0 | 1400 | 1600 | 2 | 3.3 | 3.6 | 13.0 | $4.6 \times 10^2$ | ○ |
| 11 | 40 | 10 | 50 | 0 | 0 | 1400 | 1500 | 2 | 3.4 | 4.1 | 16.9 | $9.9 \times 10$ | ○ |
| 12 | 40 | 13 | 46 | 0 | 1 | 1400 | 1550 | 2 | 3.4 | 4.7 | 16.6 | $7.2 \times 10$ | ○ |
| 13 | 40 | 17 | 13 | 30 | 0 | 1400 | 1600 | 2 | 3.6 | 4.9 | 17.5 | $4.3 \times 10$ | ○ |
| *14 | 50 | 26 | 24 | 0 | 0 | 467 | 1400 | 2 | 0.7 | 0.3 | 1.1 | $2.0 \times 10^7$ | x |
| 15 | 50 | 20 | 30 | 0 | 0 | 467 | 1500 | 2 | 3.2 | 4.6 | 19.3 | $2.7 \times 10$ | ○ |
| 16 | 50 | 30 | 20 | 0 | 0 | 467 | 1550 | 2 | 3.4 | 5.8 | 18.1 | $1.6 \times 10$ | ○ |

TABLE 1-continued

| No. | $Fe_2O_3$ (mol %) | $SiO_2$ (mol %) | MgO (mol %) | $ZrO_2$ (mol %) | $Al_2O_3$ (mol %) | Molding Pressure (MPa) | Firing Temperature (°C.) | Firing Time (hrs.) | Attenuation 10 GHz (dB) | Attenuation 20 GHz (dB) | Attenuation 40 GHz (dB) | Volume Resistivity (Ω · m) | Evolution of Suppressing Resonance |
|---|---|---|---|---|---|---|---|---|---|---|---|---|---|
| 17 | 50 | 20 | 27 | 3 | 0 | 467 | 1600 | 2 | 3.3 | 6.8 | 13.6 | $1.3 \times 10$ | ○ |
| *18 | 50 | 10 | 0 | 40 | 0 | 934 | 1400 | 2 | 1.2 | 0.8 | 1.4 | $7.8 \times 10^5$ | x |
| 19 | 50 | 27 | 23 | 0 | 0 | 934 | 1500 | 2 | 3.4 | 7.7 | 20.7 | $2.7 \times 10$ | ○ |
| 20 | 50 | 10 | 0 | 0 | 40 | 934 | 1550 | 2 | 4.1 | 6.9 | 16.6 | $1.5 \times 10$ | ○ |
| 21 | 50 | 23 | 17 | 10 | 0 | 934 | 1600 | 2 | 3.4 | 6.8 | 14.7 | $1.4 \times 10$ | ○ |
| *22 | 50 | 20 | 20 | 10 | 0 | 1400 | 1400 | 2 | 1.0 | 1.3 | 1.8 | $4.8 \times 10^5$ | x |
| 23 | 50 | 10 | 20 | 20 | 0 | 1400 | 1500 | 2 | 3.1 | 7.2 | 20.3 | $4.6 \times 10$ | ○ |
| 24 | 50 | 0 | 20 | 0 | 30 | 1400 | 1550 | 2 | 4.6 | 6.3 | 18.1 | $3.8 \times 10$ | ○ |
| 25 | 50 | 34 | 15 | 1 | 0 | 1400 | 1600 | 2 | 3.4 | 7.0 | 16.0 | $3.4 \times 10$ | ○ |
| *26 | 50 | 13 | 27 | 10 | 0 | 1868 | 1400 | 2 | 0.8 | 1.3 | 1.7 | $5.2 \times 10^5$ | x |
| 27 | 50 | 27 | 20 | 0 | 3 | 1868 | 1500 | 2 | 3.5 | 6.9 | 19.3 | $2.0 \times 10^2$ | ○ |
| 28 | 50 | 4 | 26 | 0 | 20 | 1868 | 1550 | 2 | 4.7 | 6.1 | 14.7 | $1.9 \times 10$ | ○ |
| 29 | 50 | 16 | 1 | 33 | 0 | 1868 | 1600 | 2 | 3.2 | 6.2 | 16.1 | $1.3 \times 10$ | ○ |
| *30 | 60 | 22 | 18 | 0 | 0 | 467 | 1400 | 2 | 0.7 | 1.2 | 1.3 | $7.3 \times 10^8$ | x |
| 31 | 60 | 19 | 1 | 20 | 0 | 467 | 1500 | 2 | 3.5 | 8.1 | 11.3 | $4.0 \times 10^4$ | ○ |
| 32 | 60 | 0 | 40 | 0 | 0 | 467 | 1550 | 2 | 3.5 | 7.2 | 13.6 | $5.3 \times 10^2$ | ○ |
| 33 | 60 | 27 | 13 | 0 | 0 | 467 | 1600 | 2 | 3.4 | 6.2 | 14.8 | $2.2 \times 10$ | ○ |
| 34 | 60 | 16 | 20 | 4 | 0 | 934 | 1400 | 2 | 2.6 | 2.9 | 5.1 | $5.9 \times 10^2$ | ○ |
| 35 | 60 | 10 | 30 | 0 | 0 | 934 | 1500 | 2 | 3.6 | 7.6 | 14.8 | $4.5 \times 10^2$ | ○ |
| 36 | 60 | 25 | 15 | 0 | 0 | 934 | 1550 | 2 | 3.6 | 7.1 | 17.5 | $1.4 \times 10$ | ○ |
| 37 | 60 | 40 | 0 | 0 | 0 | 934 | 1600 | 2 | 3.6 | 7.2 | 19.2 | $2.4 \times 10$ | ○ |
| 38 | 60 | 21 | 19 | 0 | 0 | 1400 | 1400 | 2 | 3.5 | 7.9 | 7.0 | $8.9 \times 10^3$ | ○ |
| 39 | 60 | 28 | 12 | 0 | 0 | 1400 | 1500 | 2 | 3.6 | 7.2 | 15.6 | $5.8 \times 10$ | ○ |
| 40 | 60 | 26 | 9 | 0 | 5 | 1400 | 1550 | 2 | 4.1 | 8.6 | 21.2 | $5.4 \times 10$ | ○ |
| 41 | 60 | 38 | 2 | 0 | 0 | 1400 | 1600 | 2 | 3.4 | 8.0 | 19.0 | $3.5 \times 10$ | ○ |
| 42 | 60 | 2 | 35 | 3 | 0 | 1868 | 1400 | 2 | 2.4 | 5.6 | 8.2 | $7.3 \times 10^2$ | ○ |
| 43 | 60 | 26 | 14 | 0 | 0 | 1868 | 1500 | 2 | 3.4 | 7.0 | 14.2 | $2.2 \times 10^2$ | ○ |
| 44 | 60 | 29 | 1 | 10 | 0 | 1868 | 1550 | 2 | 3.5 | 6.6 | 15.7 | $5.1 \times 10$ | ○ |
| 45 | 60 | 14 | 21 | 5 | 0 | 1868 | 1600 | 2 | 3.1 | 8.1 | 17.3 | $3.5 \times 10$ | ○ |
| 46 | 90 | 4 | 5 | 1 | 0 | 467 | 1400 | 2 | 3.5 | 5.8 | 13.6 | $4.6 \times 10^3$ | ○ |
| 47 | 90 | 1 | 5 | 4 | 0 | 467 | 1500 | 2 | 4.6 | 6.8 | 11.8 | $4.4 \times 10^2$ | ○ |
| 48 | 90 | 4 | 6 | 0 | 0 | 467 | 1550 | 2 | 4.2 | 7.3 | 11.3 | $1.7 \times 10^2$ | ○ |
| 49 | 90 | 4 | 2 | 4 | 0 | 467 | 1600 | 2 | 4.8 | 7.1 | 13.5 | $1.2 \times 10^2$ | ○ |
| 50 | 90 | 6 | 2 | 2 | 0 | 934 | 1400 | 2 | 3.5 | 7.2 | 10.5 | $4.6 \times 10^5$ | ○ |
| 51 | 90 | 7 | 2 | 1 | 0 | 934 | 1500 | 2 | 3.4 | 7.9 | 12.6 | $4.0 \times 10^3$ | ○ |
| 52 | 90 | 0 | 10 | 0 | 0 | 934 | 1550 | 2 | 3.6 | 6.3 | 11.9 | $3.5 \times 10^2$ | ○ |
| 53 | 90 | 5 | 5 | 0 | 0 | 934 | 1600 | 2 | 3.5 | 8.3 | 14.6 | $3.5 \times 10$ | ○ |
| 54 | 90 | 4 | 4 | 2 | 0 | 1400 | 1400 | 2 | 3.7 | 6.8 | 13.5 | $3.9 \times 10^3$ | ○ |
| 55 | 90 | 10 | 0 | 0 | 0 | 1400 | 1500 | 2 | 3.6 | 6.3 | 15.0 | $3.6 \times 10^3$ | ○ |
| 56 | 90 | 2 | 8 | 0 | 0 | 1400 | 1550 | 2 | 3.5 | 6.3 | 13.6 | $2.7 \times 10^2$ | ○ |
| 57 | 90 | 7 | 3 | 0 | 0 | 1400 | 1600 | 2 | 3.5 | 6.8 | 12.3 | $1.1 \times 10$ | ○ |
| 58 | 95 | 1 | 2 | 2 | 0 | 1868 | 1400 | 2 | 3.8 | 7.6 | 12.5 | $2.8 \times 10^2$ | ○ |
| 59 | 95 | 0 | 0 | 5 | 0 | 1868 | 1500 | 2 | 2.3 | 6.7 | 12.9 | $5.3 \times 10$ | ○ |
| 60 | 95 | 0 | 4 | 1 | 0 | 1868 | 1550 | 2 | 2.5 | 4.7 | 12.6 | $3.4 \times 10$ | ○ |
| 61 | 95 | 5 | 0 | 0 | 0 | 1868 | 1600 | 2 | 3.0 | 4.0 | 11.3 | $2.4 \times 10$ | ○ |
| *62 | 100 | 0 | 0 | 0 | 0 | 1868 | 1400 | 2 | 1.2 | 1.2 | 1.2 | $4.5 \times 10^8$ | x |

Sample numbers marked with * are not within the scope of the present invention.

As can be seen from Table 1, samples Nos. 1 to 4 did not achieve substantial attenuation of 2 dB or more due to the $Fe_2O_3$ content of less than 20%, and allowed resonance to occur with $\Delta S_{21}$ being 0.1 dB or more in the evaluation of resonance suppression.

In the cases of samples Nos. 14, 18, 22 and 26, dense sintered body could not be obtained due to a low firing temperature of 1400° C., in spite of relatively high content of 50 mol % in total of $SiO_2$, MgO and $ZrO_2$. As a result, sufficient attenuation of 2 dB or more could not be achieved and allowed resonance to occur with $\Delta S_{21}$ being 0.1 dB or more in the evaluation of resonance suppression.

Dense sintered body could not be obtained from sample No. 30, too, due to the low molding pressure of 467 MPa and low firing temperature of 1400° C., although total content of $SiO_2$, MgO and $ZrO_2$ is set to a low value of 40 mol %. As a result, sufficient attenuation of 2 dB or more could not be achieved and allowed resonance to occur with $\Delta S_{21}$ being 0.1 dB or more in the evaluation of resonance suppression.

Sample No. 62 did not contain $SiO_2$, MgO and $ZrO_2$ and, as a result, sufficient attenuation of 2 dB or more could not be achieved and allowed resonance to occur with $\Delta S_{21}$ being 0.1 dB or more in the evaluation of resonance suppression.

Samples Nos. 5 to 13, 15 to 17, 19 to 21, 23 to 25, 27 to 29 and 31 to 61 that are examples of the present invention achieved sufficient attenuation of 2 dB or higher and prevented resonance from occurring, thus showing satisfactory performance as the electromagnetic wave absorber. Among these samples, samples Nos. 6, 20, 24, 28 and 40 that contained $Al_2O_3$ in concentrations from 1 to 50 mol % achieved attenuation of 4 dB or more at 10 GHz, showing excellent electromagnetic wave absorbing characteristic.

Example 2

Powders of $Fe_2O_3$ and NiO weighed in the proportions shown in Table 2 were used as starting materials. Slurry having a predetermined viscosity was obtained by mixing the starting material and water in a wet mixing process carried out in a ball mill for eight hours. The slurry was then dried and granulated using a spray drier, and the granulated powder was molded under the molding pressures shown in Table 1 in the pressure powder molding process, thereby to obtain green bodies. The green bodies were fired under the firing conditions shown in Table 1, and electromagnetic wave absorber 16 measuring 3 mm×7 mm×0.4 mm and an evaluation sample measuring 20 mm in outer diameter and 2 mm in thickness were made.

Attenuation of electromagnetic wave achieved by installing the electromagnetic wave absorber 16 and volume resistivity of the evaluation sample were measured similarly to Example 1, and the effect of the electromagnetic wave absorber 16 in suppressing resonance was evaluated similarly to Example 1.

Calculated values of attenuation of electromagnetic wave, measurements of volume resistivity and the results of evaluating the effect of suppressing resonance are shown in Table 2.

TABLE 2

| No. | $Fe_2O_3$ (mol %) | NiO (mol %) | Molding Pressure (MPa) | Firing Temperature (° C.) | Firing Time (hrs.) | Attenuation (dB) | Volume Resistivity ($\Omega \cdot m$) | Evolution of Suppressing Resonance |
|---|---|---|---|---|---|---|---|---|
| *63 | 40 | 60 | 1400 | 1150 | 1 | 0.5 | $3.0 \times 10^7$ | x |
| *64 | 40 | 60 | 1400 | 1200 | 1 | 0.6 | $2.6 \times 10^6$ | x |
| *65 | 40 | 60 | 1400 | 1250 | 1 | 0.8 | $2.7 \times 10^5$ | x |
| *66 | 40 | 60 | 1400 | 1300 | 1 | 0.9 | $3.8 \times 10^6$ | x |
| *67 | 50 | 50 | 1400 | 1150 | 1 | 1.0 | $4.2 \times 10^6$ | x |
| 68 | 50 | 50 | 1400 | 1200 | 1 | 2.0 | $1.9 \times 10^5$ | ○ |
| 69 | 50 | 50 | 1400 | 1250 | 1 | 2.4 | $5.8 \times 10^5$ | ○ |
| 70 | 50 | 50 | 1400 | 1300 | 1 | 3.0 | $4.7 \times 10^5$ | ○ |
| *71 | 60 | 40 | 1400 | 1150 | 1 | 0.9 | $2.4 \times 10^6$ | x |
| 72 | 60 | 40 | 1400 | 1200 | 1 | 12.5 | $3.1 \times 10^5$ | ○ |
| 73 | 60 | 40 | 1400 | 1250 | 1 | 13.1 | $2.9 \times 10^5$ | ○ |
| 74 | 60 | 40 | 1400 | 1300 | 1 | 14.5 | $2.3 \times 10^5$ | ○ |
| *75 | 70 | 30 | 467 | 1150 | 1 | 1.3 | $1.7 \times 10^6$ | x |
| *76 | 70 | 30 | 467 | 1200 | 1 | 0.9 | $1.7 \times 10^5$ | x |
| *77 | 70 | 30 | 467 | 1250 | 1 | 1.2 | $4.1 \times 10^3$ | x |
| *78 | 70 | 30 | 467 | 1300 | 1 | 1.3 | $4.1 \times 10^2$ | x |
| *79 | 70 | 30 | 934 | 1150 | 1 | 1.2 | $5.5 \times 10^4$ | x |
| 80 | 70 | 30 | 934 | 1200 | 1 | 16.6 | 2.2 | ○ |
| 81 | 70 | 30 | 934 | 1250 | 1 | 15.7 | $1.7 \times 10^3$ | ○ |
| 82 | 70 | 30 | 934 | 1300 | 1 | 17.1 | $1.3 \times 10^5$ | ○ |
| *83 | 70 | 30 | 1400 | 1150 | 1 | 1.2 | $1.2 \times 10^4$ | x |
| 84 | 70 | 30 | 1400 | 1200 | 1 | 16.2 | $3.5 \times 10$ | ○ |
| 85 | 70 | 30 | 1400 | 1250 | 1 | 17.0 | $1.3 \times 10$ | ○ |
| 86 | 70 | 30 | 1400 | 1300 | 1 | 16.4 | $7.9 \times 10^4$ | ○ |
| *87 | 70 | 30 | 1868 | 1150 | 1 | 1.2 | 4 | x |
| 88 | 70 | 30 | 1868 | 1200 | 1 | 16.6 | 3.5 | ○ |
| 89 | 70 | 30 | 1868 | 1250 | 1 | 15.4 | $8.0 \times 10^4$ | ○ |
| 90 | 70 | 30 | 1868 | 1300 | 1 | 17.6 | $3.3 \times 10^4$ | ○ |
| *91 | 80 | 20 | 467 | 1150 | 1 | 0.8 | $3.7 \times 10^6$ | x |
| *92 | 80 | 20 | 467 | 1200 | 1 | 1.1 | $3.0 \times 10^5$ | x |
| *93 | 80 | 20 | 467 | 1250 | 1 | 0.5 | $2.1 \times 10^3$ | x |
| *94 | 80 | 20 | 467 | 1300 | 1 | 1.2 | $7.0 \times 10$ | x |
| *95 | 80 | 20 | 934 | 1150 | 1 | 1.2 | $6.1 \times 10^4$ | x |
| 96 | 80 | 20 | 934 | 1200 | 1 | 14.3 | 3.1 | ○ |
| 97 | 80 | 20 | 934 | 1250 | 1 | 15.9 | 2.3 | ○ |
| 98 | 80 | 20 | 934 | 1300 | 1 | 15.1 | 1.4 | ○ |
| *99 | 80 | 20 | 1400 | 1150 | 1 | 0.9 | $8.1 \times 10$ | x |
| 100 | 80 | 20 | 1400 | 1200 | 1 | 15.6 | $8.2 \times 10$ | ○ |
| 101 | 80 | 20 | 1400 | 1250 | 1 | 16.9 | $6.4 \times 10^4$ | ○ |
| 102 | 80 | 20 | 1400 | 1300 | 1 | 14.6 | 3.2 | ○ |
| *103 | 80 | 20 | 1868 | 1150 | 1 | 1.6 | 1.8 | x |
| 104 | 80 | 20 | 1868 | 1200 | 1 | 17.4 | $7.9 \times 10$ | ○ |
| 105 | 80 | 20 | 1868 | 1250 | 1 | 17.0 | $4.7 \times 10$ | ○ |
| 106 | 80 | 20 | 1868 | 1300 | 1 | 16.3 | 2.1 | ○ |
| *107 | 95 | 5 | 467 | 1150 | 1 | 1.4 | $2.0 \times 10^6$ | x |
| *108 | 95 | 5 | 467 | 1200 | 1 | 0.9 | $4.7 \times 10^4$ | x |
| 109 | 95 | 5 | 467 | 1250 | 1 | 16.2 | 9.4 | ○ |
| 110 | 95 | 5 | 467 | 1300 | 1 | 17.4 | 2.4 | ○ |
| *111 | 95 | 5 | 934 | 1150 | 1 | 1.0 | $1.4 \times 10^5$ | x |
| 112 | 95 | 5 | 934 | 1200 | 1 | 10.1 | 3.9 | ○ |
| 113 | 95 | 5 | 934 | 1250 | 1 | 17.2 | 3.0 | ○ |
| 114 | 95 | 5 | 934 | 1300 | 1 | 17.8 | 2.1 | ○ |
| 115 | 95 | 5 | 1400 | 1150 | 1 | 7.0 | 8.7 | ○ |
| 116 | 95 | 5 | 1400 | 1200 | 1 | 12.3 | 5.0 | ○ |
| 117 | 95 | 5 | 1400 | 1250 | 1 | 13.6 | 1.4 | ○ |
| 118 | 95 | 5 | 1400 | 1300 | 1 | 15.7 | 1.0 | ○ |
| 119 | 95 | 5 | 1868 | 1150 | 1 | 6.8 | $1.1 \times 10$ | ○ |
| 120 | 95 | 5 | 1868 | 1200 | 1 | 11.7 | 3.6 | ○ |
| 121 | 95 | 5 | 1868 | 1250 | 1 | 11.7 | 2.2 | ○ |
| 122 | 95 | 5 | 1868 | 1300 | 1 | 12.2 | 4.2 | ○ |
| *123 | 100 | 0 | 1868 | 1150 | 1 | 1.2 | $4.5 \times 10^6$ | x |

Sample numbers marked with * are not within the scope of the present invention.

As can be seen from Table 2, samples Nos. 63 to 66 did not achieve sufficient attenuation of 2 dB or more due to the $Fe_2O_3$ content of less than 50%, and allowed resonance to occur with A $S_{21}$ being 0.1 dB or more in the evaluation of resonance suppression.

Samples Nos. 75 to 78, 91 to 94, 107 and 108 did not achieve sufficient attenuation of 2 dB or more since dense sintered body could not obtained due to a low sintering pressure of 467 MPa, and allowed resonance to occur with $\Delta S_{21}$ being 0.1 dB or more in the evaluation of resonance suppression.

Dense sintered body could not be obtained from sample Nos. 67, 71, 79, 83, 87, 95, 99, 103 and 111, too, due to the low firing temperature of 1150° C., although the molding pressure was 934 MPa or higher, and sufficient attenuation of 2 dB or more could not be achieved while allowing resonance to occur with $\Delta S_{21}$ being 0.1 dB or more in the evaluation of resonance suppression.

Sample No. 61 did not contain NiO and, as a result, sufficient attenuation of 2 dB or more could not be achieved and allowed resonance to occur with $\Delta S_{21}$ being 0.1 dB or more in the evaluation of resonance suppression.

Samples Nos. 68 to 70, 72 to 74, 80 to 82, 84 to 86, 88 to 90, 96 to 98, 100 to 102, 104 to 106, 109, 110 and 112 to 122 that are examples of the present invention achieved sufficient attenuation of 2 dB or higher and prevented resonance from occurring in mounted test, thus showing satisfactory performance as the electromagnetic wave absorber.

Example 3

Powders of $Fe_2O_3$, NiO and ZnO weighed in the proportions shown in Table 3 were used as starting materials. Slurry having a predetermined viscosity was obtained by mixing the starting material and water in a wet mixing process carried out in a ball mill for eight hours.

The slurry was then dried and granulated using a spray drier, and the granulated powder was molded under the molding pressures shown in Table 3 in the pressure powder molding process thereby to obtain green bodies.

The green bodies were fired under the firing conditions shown in Table 3, and electromagnetic wave absorber 16 measuring 3 mm×7 mm×0.4 mm were made.

Measurements of bulk density of the electromagnetic wave absorber 16 are shown in Table 3. Relationship between the bulk density and the firing temperature is shown in FIG. 5 for samples Nos. 124 to 143 and in FIG. 6 for samples Nos. 144 to 163, according to the molding pressure.

TABLE 3

| No. | $Fe_2O_3$ (モル%) | NiO (モル%) | ZnO (モル%) | Molding Pressure (MPa) | Firing Temperature (° C.) | Bulk Density (g/cm³) |
|---|---|---|---|---|---|---|
| 124 | 90 | 10 | 0 | 467 | 1100 | 4.5 |
| 125 | 90 | 10 | 0 | 467 | 1150 | 4.7 |
| 126 | 90 | 10 | 0 | 467 | 1200 | 4.9 |
| 127 | 90 | 10 | 0 | 467 | 1250 | 4.9 |
| 128 | 90 | 10 | 0 | 467 | 1300 | 4.9 |
| 129 | 90 | 10 | 0 | 934 | 1100 | 4.9 |
| 130 | 90 | 10 | 0 | 934 | 1150 | 5.1 |
| 131 | 90 | 10 | 0 | 934 | 1200 | 5.2 |
| 132 | 90 | 10 | 0 | 934 | 1250 | 5.2 |
| 133 | 90 | 10 | 0 | 934 | 1300 | 5.1 |
| 134 | 90 | 10 | 0 | 1400 | 1100 | 4.9 |
| 135 | 90 | 10 | 0 | 1400 | 1150 | 5.0 |
| 136 | 90 | 10 | 0 | 1400 | 1200 | 5.1 |
| 137 | 90 | 10 | 0 | 1400 | 1250 | 5.1 |
| 138 | 90 | 10 | 0 | 1400 | 1300 | 5.0 |
| 139 | 90 | 10 | 0 | 1868 | 1100 | 4.9 |
| 140 | 90 | 10 | 0 | 1868 | 1150 | 5.0 |
| 141 | 90 | 10 | 0 | 1868 | 1200 | 5.1 |
| 142 | 90 | 10 | 0 | 1868 | 1250 | 5.1 |
| 143 | 90 | 10 | 0 | 1868 | 1300 | 5.0 |
| 144 | 90 | 5 | 5 | 467 | 1100 | 5.0 |
| 145 | 90 | 5 | 5 | 467 | 1150 | 5.1 |
| 146 | 90 | 5 | 5 | 467 | 1200 | 5.1 |
| 147 | 90 | 5 | 5 | 467 | 1250 | 5.1 |
| 148 | 90 | 5 | 5 | 467 | 1300 | 5.0 |
| 149 | 90 | 5 | 5 | 934 | 1100 | 5.1 |
| 150 | 90 | 5 | 5 | 934 | 1150 | 5.1 |
| 151 | 90 | 5 | 5 | 934 | 1200 | 5.1 |
| 152 | 90 | 5 | 5 | 934 | 1250 | 5.1 |
| 153 | 90 | 5 | 5 | 934 | 1300 | 5.0 |
| 154 | 90 | 5 | 5 | 1400 | 1100 | 5.1 |
| 155 | 90 | 5 | 5 | 1400 | 1150 | 5.1 |
| 156 | 90 | 5 | 5 | 1400 | 1200 | 5.1 |
| 157 | 90 | 5 | 5 | 1400 | 1250 | 5.0 |
| 158 | 90 | 5 | 5 | 1400 | 1300 | 4.9 |
| 159 | 90 | 5 | 5 | 1868 | 1100 | 5.1 |
| 160 | 90 | 5 | 5 | 1868 | 1150 | 5.1 |
| 161 | 90 | 5 | 5 | 1868 | 1200 | 5.1 |
| 162 | 90 | 5 | 5 | 1868 | 1250 | 5.0 |
| 163 | 90 | 5 | 5 | 1868 | 1300 | 4.9 |

Figure 5:
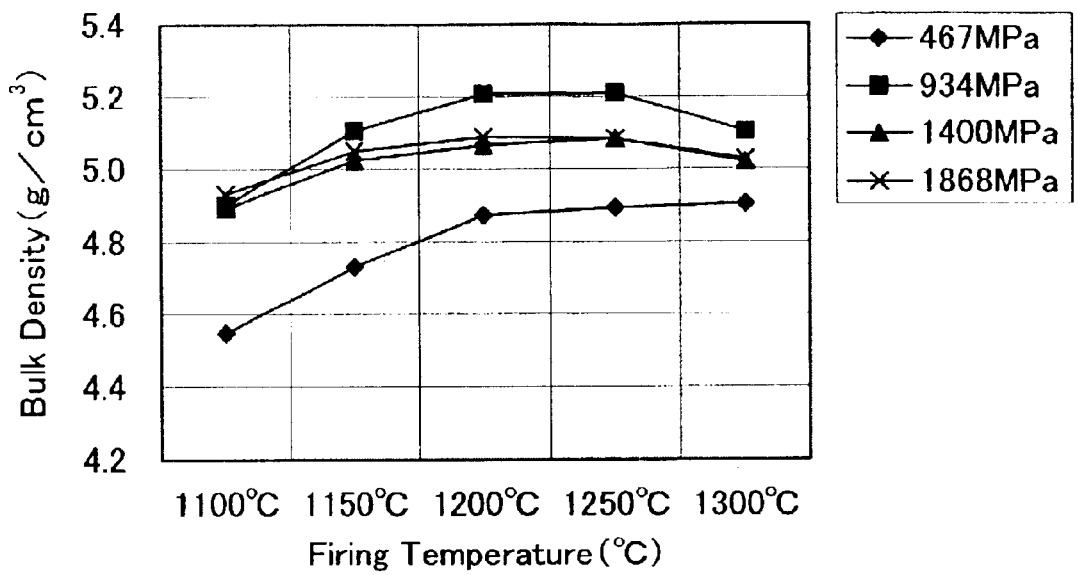
FIG. 5 is a graph showing a relation between the firing temperature and the bulk density of the electromagnetic wave absorber in Example 3.

As can be seen from FIG. 5, bulk density varied significantly with the molding pressure in samples Nos. 124 to 143 since these samples did not contain ZnO, making it impossible to carry out low-pressure molding or low-temperature firing in some cases.

Figure 6:
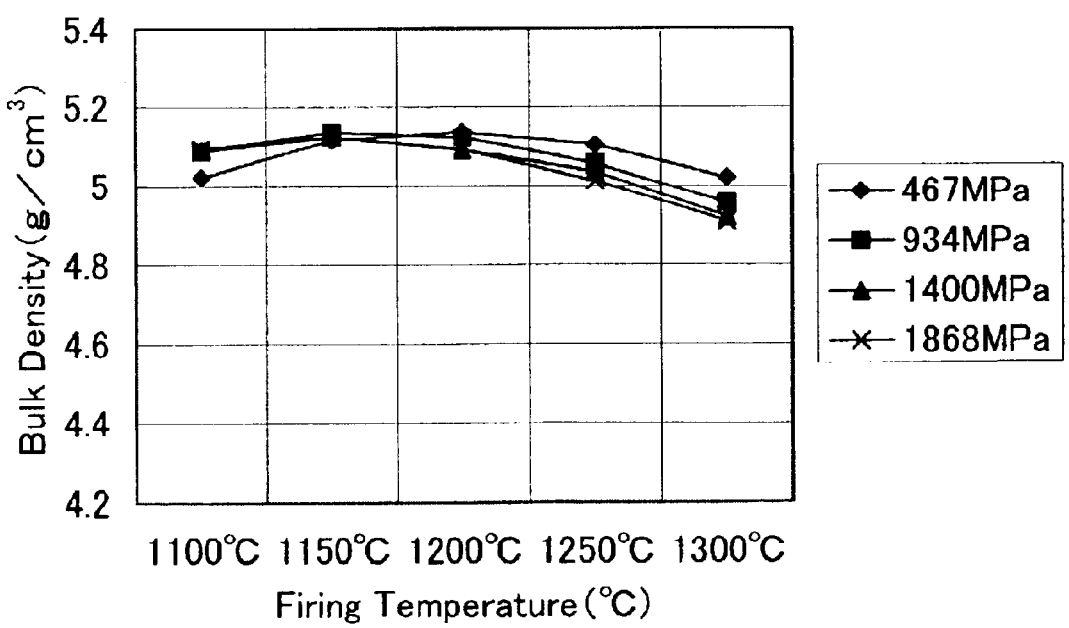
FIG. 6 is a graph showing a relation between the firing temperature and the bulk density of the electromagnetic wave absorber in Example 3.

Samples Nos. 144 to 163, on the other hand, as shown in FIG. 6, contained ZnO and showed substantially constant bulk density when the molding pressure was changed, and therefore made it possible to carry out low-pressure molding and low-temperature firing, thus decreasing the manufacturing cost.

Example 4

Powders of $Fe_2O_3$ and $Al_2O_3$ weighed in the proportions shown in Table 4 were used as starting materials. Slurry having a predetermined viscosity was obtained by mixing the starting material and water in a wet mixing process carried out in a ball mill for eight hours. The slurry was then dried and granulated using a spray drier, and the granulated powder was molded under the molding pressures shown in Table 4 in the pressure powder molding process, thereby to obtain green bodies.

The green bodies were fired under the firing conditions shown in Table 4, and electromagnetic wave absorber 16 measuring 3 mm×7 mm×0.4 mm and an evaluation sample measuring 20 mm in outer diameter and 2 mm in thickness were made.

Attenuation of electromagnetic wave achieved by installing the electromagnetic wave absorber 16 and volume resistivity of the evaluation sample were measured similarly to Example 1, and the effect of the electromagnetic wave absorber 16 in suppressing resonance was evaluated similarly to Example 1. Results of evaluating the effect of suppressing resonance are shown in Table 4.

TABLE 4

| No. | Fe$_2$O$_3$ (mol %) | Al$_2$O$_3$ (mol %) | Molding Pressure (MPa) | Firing Temperature (° C.) | Firing Time (hrs.) | Attenuation 10 GHz (dB) | Attenuation 20 GHz (dB) | Attenuation 40 GHz (dB) | Volume Resistivity (Ω · m) | Evoluation of Suppressing Resonance |
|---|---|---|---|---|---|---|---|---|---|---|
| *164 | 10 | 90 | 1400 | 1400 | 1 | 0.4 | 0.6 | 0.6 | $5.1 \times 10^{11}$ | x |
| *165 | 10 | 90 | 1400 | 1500 | 1 | 1.3 | 1.2 | 1.1 | $4.6 \times 10^{10}$ | x |
| *166 | 10 | 90 | 1400 | 1550 | 1 | 0.8 | 0.6 | 1.0 | $3.8 \times 10^{10}$ | x |
| *167 | 10 | 90 | 1400 | 1600 | 1 | 0.6 | 1.3 | 1.8 | $8.5 \times 10^{9}$ | x |
| 168 | 20 | 80 | 1400 | 1500 | 1 | 3.2 | 4.3 | 12.5 | $3.2 \times 10^{2}$ | o |
| 169 | 20 | 80 | 1400 | 1550 | 1 | 3.3 | 3.8 | 14.6 | $3.5 \times 10^{2}$ | o |
| 170 | 20 | 80 | 1400 | 1600 | 1 | 2.8 | 3.9 | 16.3 | $2.1 \times 10^{2}$ | o |
| 171 | 30 | 70 | 1400 | 1500 | 1 | 3.3 | 3.8 | 16.0 | $1.1 \times 10^{3}$ | o |
| 172 | 30 | 70 | 1400 | 1550 | 1 | 3.2 | 3.6 | 14.6 | $5.2 \times 10^{2}$ | o |
| 173 | 30 | 70 | 1400 | 1600 | 1 | 3.2 | 3.7 | 13.2 | $4.3 \times 10^{2}$ | o |
| 174 | 40 | 60 | 1400 | 1500 | 1 | 3.5 | 4.2 | 17.2 | $9.5 \times 10$ | o |
| 175 | 40 | 60 | 1400 | 1550 | 1 | 3.5 | 4.5 | 17.1 | $7.2 \times 10$ | o |
| 176 | 40 | 60 | 1400 | 1600 | 1 | 3.6 | 4.9 | 17.5 | $4.3 \times 10$ | o |
| *177 | 50 | 50 | 467 | 1400 | 1 | 0.8 | 0.3 | 1.2 | $1.3 \times 10^{7}$ | x |
| 178 | 50 | 50 | 467 | 1500 | 1 | 3.6 | 5.3 | 20.2 | $2.5 \times 10$ | o |
| 179 | 50 | 50 | 467 | 1550 | 1 | 3.5 | 6.7 | 19.2 | $1.8 \times 10$ | o |
| 180 | 50 | 50 | 467 | 1600 | 1 | 3.7 | 7.3 | 14.9 | $1.0 \times 10$ | o |
| *181 | 50 | 50 | 934 | 1400 | 1 | 1.1 | 1.0 | 1.5 | $8.3 \times 10^{5}$ | x |
| 182 | 50 | 50 | 934 | 1500 | 1 | 3.8 | 7.1 | 21.0 | $2.3 \times 10$ | o |
| 183 | 50 | 50 | 934 | 1550 | 1 | 3.7 | 7.2 | 17.6 | $1.6 \times 10$ | o |
| 184 | 50 | 50 | 934 | 1600 | 1 | 3.7 | 7.3 | 15.2 | $1.2 \times 10$ | o |
| *185 | 50 | 50 | 1400 | 1400 | 1 | 1.1 | 1.3 | 1.7 | $5.2 \times 10^{5}$ | x |
| 186 | 50 | 50 | 1400 | 1500 | 1 | 3.6 | 7.3 | 19.8 | $5.0 \times 10$ | o |
| 187 | 50 | 50 | 1400 | 1550 | 1 | 3.5 | 7.5 | 19.4 | $4.2 \times 10$ | o |
| 188 | 50 | 50 | 1400 | 1600 | 1 | 3.8 | 7.2 | 17.0 | $3.8 \times 10$ | o |
| *189 | 50 | 50 | 1868 | 1400 | 1 | 0.8 | 1.3 | 1.7 | $5.2 \times 10^{5}$ | x |
| 190 | 50 | 50 | 1868 | 1500 | 1 | 3.6 | 6.8 | 20.3 | $2.2 \times 10^{2}$ | o |
| 191 | 50 | 50 | 1868 | 1550 | 1 | 3.7 | 7.2 | 15.1 | $1.8 \times 10$ | o |
| 192 | 50 | 50 | 1868 | 1600 | 1 | 3.6 | 7.3 | 16.4 | $1.1 \times 10$ | o |
| *193 | 60 | 40 | 467 | 1400 | 1 | 0.8 | 1.3 | 1.2 | $8.7 \times 10^{8}$ | x |
| 194 | 60 | 40 | 467 | 1500 | 1 | 3.8 | 8.3 | 12.2 | $4.3 \times 10^{4}$ | o |
| 195 | 60 | 40 | 467 | 1550 | 1 | 3.9 | 8.5 | 14.6 | $5.1 \times 10^{2}$ | o |
| 196 | 60 | 40 | 467 | 1600 | 1 | 3.7 | 8.4 | 15.7 | $2.1 \times 10$ | o |
| 197 | 60 | 40 | 934 | 1400 | 1 | 2.2 | 2.8 | 4.1 | $5.7 \times 10^{2}$ | o |
| 198 | 60 | 40 | 934 | 1500 | 1 | 3.7 | 7.3 | 14.2 | $4.6 \times 10^{2}$ | o |
| 199 | 60 | 40 | 934 | 1550 | 1 | 3.8 | 7.1 | 17.3 | $1.3 \times 10$ | o |
| 200 | 60 | 40 | 934 | 1600 | 1 | 3.9 | 7.5 | 19.6 | $2.2 \times 10$ | o |
| 201 | 60 | 40 | 1400 | 1400 | 1 | 3.7 | 8.2 | 6.8 | $8.8 \times 10^{3}$ | o |
| 202 | 60 | 40 | 1400 | 1500 | 1 | 4.0 | 8.2 | 16.0 | $5.5 \times 10$ | o |
| 203 | 60 | 40 | 1400 | 1550 | 1 | 4.1 | 8.6 | 20.3 | $5.2 \times 10$ | o |
| 204 | 60 | 40 | 1400 | 1600 | 1 | 3.9 | 8.3 | 19.6 | $2.9 \times 10$ | o |
| 205 | 60 | 40 | 1868 | 1400 | 1 | 2.6 | 5.3 | 8.3 | $6.4 \times 10^{2}$ | o |
| 206 | 60 | 40 | 1868 | 1500 | 1 | 3.6 | 7.3 | 14.6 | $2.6 \times 10^{2}$ | o |
| 207 | 60 | 40 | 1868 | 1550 | 1 | 3.7 | 7.6 | 16.7 | $6.1 \times 10$ | o |
| 208 | 60 | 40 | 1868 | 1600 | 1 | 3.3 | 8.3 | 18.5 | $3.0 \times 10$ | o |
| 209 | 90 | 10 | 467 | 1400 | 1 | 3.8 | 5.5 | 12.2 | $4.9 \times 10^{3}$ | o |
| 210 | 90 | 10 | 467 | 1500 | 1 | 4.3 | 7.2 | 12.8 | $3.4 \times 10^{2}$ | o |
| 211 | 90 | 10 | 467 | 1550 | 1 | 4.4 | 7.1 | 11.6 | $1.9 \times 10^{2}$ | o |
| 212 | 90 | 10 | 467 | 1600 | 1 | 5.2 | 7.3 | 13.3 | $1.0 \times 10^{2}$ | o |
| 213 | 90 | 10 | 934 | 1400 | 1 | 3.7 | 7.2 | 11.3 | $5.0 \times 10^{5}$ | o |
| 214 | 90 | 10 | 934 | 1500 | 1 | 3.6 | 7.4 | 13.6 | $3.7 \times 10^{3}$ | o |
| 215 | 90 | 10 | 934 | 1550 | 1 | 3.7 | 7.2 | 12.9 | $4.1 \times 10^{2}$ | o |
| 216 | 90 | 10 | 934 | 1600 | 1 | 3.9 | 7.3 | 13.8 | $2.6 \times 10$ | o |
| 217 | 90 | 10 | 1400 | 1400 | 1 | 4.2 | 7.1 | 12.2 | $3.8 \times 10^{3}$ | o |
| 218 | 90 | 10 | 1400 | 1500 | 1 | 4.1 | 7.3 | 14.6 | $2.6 \times 10^{3}$ | o |
| 219 | 90 | 10 | 1400 | 1550 | 1 | 4.1 | 7.3 | 13.8 | $2.5 \times 10^{2}$ | o |
| 220 | 90 | 10 | 1400 | 1600 | 1 | 4.2 | 7.5 | 11.7 | $1.7 \times 10$ | o |
| 221 | 90 | 10 | 1868 | 1400 | 1 | 3.9 | 8.2 | 13.3 | $2.5 \times 10^{2}$ | o |
| 222 | 90 | 10 | 1868 | 1500 | 1 | 2.2 | 6.3 | 12.8 | $5.2 \times 10$ | o |
| 223 | 90 | 10 | 1868 | 1550 | 1 | 2.8 | 4.5 | 13.0 | $3.7 \times 10$ | o |
| 224 | 90 | 10 | 1868 | 1600 | 1 | 2.9 | 4.2 | 11.4 | $2.6 \times 10$ | o |
| *225 | 100 | 0 | 1868 | 1400 | 1 | 1.2 | 1.2 | 1.2 | $4.5 \times 10^{8}$ | x |

Sample numbers marked with * are not within the scope of the present invention.

As can be seen from Table 4, samples Nos. 164 to 167 did not achieve sufficient attenuation of 2 dB or more due to the Fe$_2$O$_3$ content of less than 20%, and allowed resonance to occur with A S$_{21}$ being 0.1 dB or more in the evaluation of resonance suppression.

In the case of samples Nos. 177, 181, 185 and 189, dense sintered body could not be obtained due to low firing temperature of 1400° C., in spite of relatively high content of 50% for Al$_2$O$_3$ of which sintering temperature is 1500° C. As a result, sufficient attenuation of 2 dB or more could not be achieved and resonance occurred with ΔS$_{21}$ being 0.1 dB or more in the evaluation of resonance suppression.

Dense sintered body could not be obtained also from sample No. 193 due to the low molding pressure of 467 MPa and low firing temperature of 1400° C., although Al$_2$O$_3$ content is set to a low proportion of 40%. As a result, sufficient attenuation of 2 dB or more could not be achieved while allowing resonance to occur with $\Delta S_{21}$ being 0.1 dB or more in the evaluation of resonance suppression.

Sample No. 225 did not contain $Al_2O_3$ and, as a result, did not achieve sufficient attenuation of 2 dB or more and allowed resonance to occur with $\Delta S_{21}$ being 0.1 dB or more in the evaluation of resonance suppression.

Samples Nos. 168 to 176, 178 to 180, 182 to 184, 186 to 188, 190 to 192 and 194 to 224 that are examples of the present invention achieved sufficient attenuation of 2 dB or higher and prevented resonance from occurring, thus showing satisfactory performance as the electromagnetic wave absorber.

Example 5

Powders of $Fe_2O_3$, $Al_2O_3$ and ZnO weighed in the proportions shown in Table 5 were used as starting materials. Slurry having a predetermined viscosity was obtained by mixing the starting material and water in a wet mixing process carried out in a ball mill for eight hours. The slurry was then dried and granulated using a spray drier, and the granulated powder was molded under the molding pressures shown in Table 5 in the pressure powder molding process thereby to obtain green bodies.

The green bodies were fired under the firing conditions shown in Table 5, and electromagnetic wave absorber 16 measuring 3 mm×7 mm×0.4 mm were made.

Measurements of bulk density of the electromagnetic wave absorber 16 fabricated as described above are shown in Table 5. Relationship between the bulk density and the firing temperature is shown in FIG. 7 for samples Nos. 226 to 245 and in FIG. 8 for samples Nos. 246 to 265, according to the molding pressure.

TABLE 5

| No. | $Fe_2O_3$ (mol %) | $Al_2O_3$ (mol %) | ZnO (mol %) | Molding Pressure (MPa) | Firing Temperature (° C.) | Bulk Density (g/cm³) |
|---|---|---|---|---|---|---|
| 226 | 90 | 10 | 0 | 467 | 1400 | 3.78 |
| 227 | 90 | 10 | 0 | 467 | 1450 | 4.60 |
| 228 | 90 | 10 | 0 | 467 | 1500 | 4.85 |
| 229 | 90 | 10 | 0 | 467 | 1550 | 4.92 |
| 230 | 90 | 10 | 0 | 467 | 1600 | 5.02 |
| 231 | 90 | 10 | 0 | 934 | 1400 | 4.20 |
| 232 | 90 | 10 | 0 | 934 | 1450 | 4.84 |
| 233 | 90 | 10 | 0 | 934 | 1500 | 4.95 |
| 234 | 90 | 10 | 0 | 934 | 1550 | 5.10 |
| 235 | 90 | 10 | 0 | 934 | 1600 | 4.96 |
| 236 | 90 | 10 | 0 | 1400 | 1400 | 4.58 |
| 237 | 90 | 10 | 0 | 1400 | 1450 | 4.78 |
| 238 | 90 | 10 | 0 | 1400 | 1500 | 4.97 |
| 239 | 90 | 10 | 0 | 1400 | 1550 | 5.08 |
| 240 | 90 | 10 | 0 | 1400 | 1600 | 5.12 |
| 241 | 90 | 10 | 0 | 1868 | 1400 | 4.69 |
| 242 | 90 | 10 | 0 | 1868 | 1450 | 4.78 |
| 243 | 90 | 10 | 0 | 1868 | 1500 | 5.15 |
| 244 | 90 | 10 | 0 | 1868 | 1550 | 5.08 |
| 245 | 90 | 10 | 0 | 1868 | 1600 | 5.12 |
| 246 | 90 | 5 | 5 | 467 | 1400 | 4.87 |
| 247 | 90 | 5 | 5 | 467 | 1450 | 4.95 |
| 248 | 90 | 5 | 5 | 467 | 1500 | 5.01 |
| 249 | 90 | 5 | 5 | 467 | 1550 | 5.12 |
| 250 | 90 | 5 | 5 | 467 | 1600 | 5.13 |
| 251 | 90 | 5 | 5 | 934 | 1400 | 5.02 |
| 252 | 90 | 5 | 5 | 934 | 1450 | 5.11 |
| 253 | 90 | 5 | 5 | 934 | 1500 | 5.16 |
| 254 | 90 | 5 | 5 | 934 | 1550 | 5.08 |
| 255 | 90 | 5 | 5 | 934 | 1600 | 5.02 |
| 256 | 90 | 5 | 5 | 1400 | 1400 | 4.96 |
| 257 | 90 | 5 | 5 | 1400 | 1450 | 5.13 |
| 258 | 90 | 5 | 5 | 1400 | 1500 | 5.20 |
| 259 | 90 | 5 | 5 | 1400 | 1550 | 5.23 |
| 260 | 90 | 5 | 5 | 1400 | 1600 | 5.18 |
| 261 | 90 | 5 | 5 | 1868 | 1400 | 5.03 |
| 262 | 90 | 5 | 5 | 1868 | 1450 | 5.14 |
| 263 | 90 | 5 | 5 | 1868 | 1500 | 5.17 |
| 264 | 90 | 5 | 5 | 1868 | 1550 | 5.08 |
| 265 | 90 | 5 | 5 | 1868 | 1600 | 5.06 |

Figure 7:
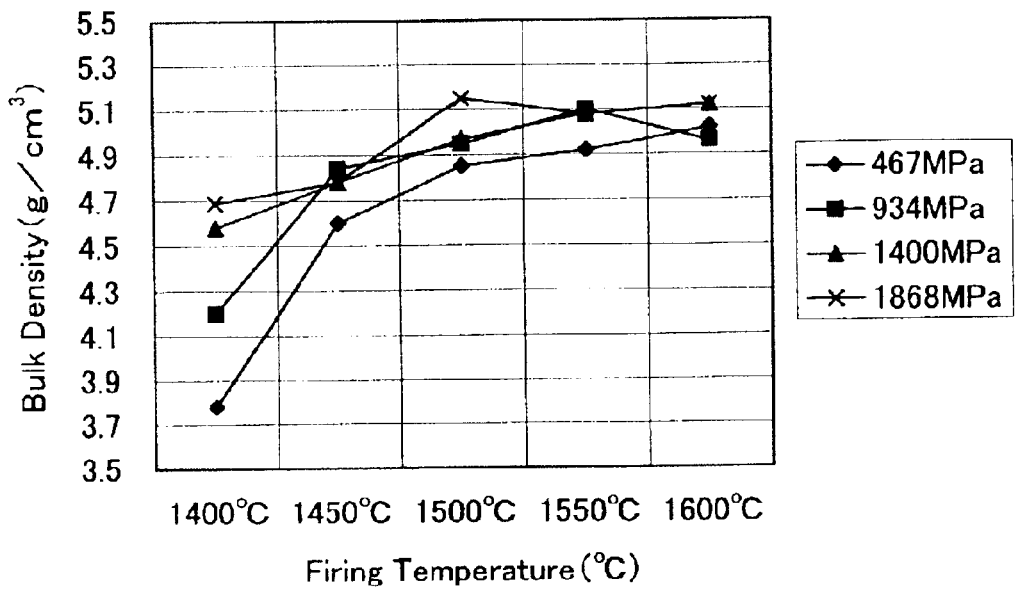
FIG. 7 is a graph showing a relation between the firing temperature and the bulk density of the electromagnetic wave absorber in Example.

As can be seen from FIG. 7, bulk density varied greatly with the molding pressure in samples Nos. 226 to 245 since these samples did not contain ZnO, thus making it impossible to carry out low-pressure molding or low-temperature firing in some cases.

Figure 8:
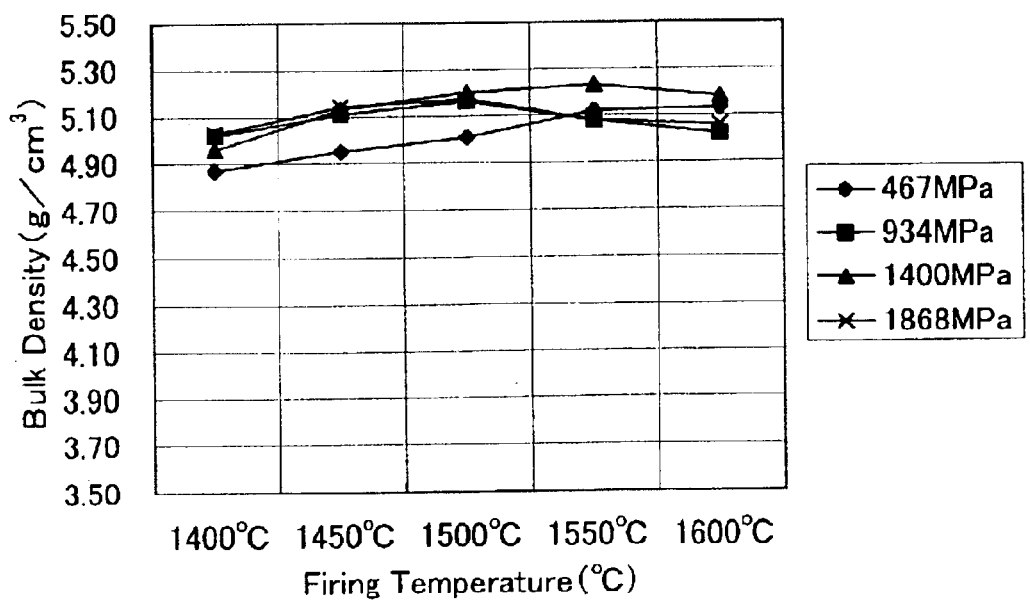
FIG. 8 is a graph showing a relation between the firing temperature and the bulk density of the electromagnetic wave absorber in Example.

Samples Nos. 246 to 265, on the other hand, as shown in FIG. 8, contained ZnO and showed substantially constant bulk density when the molding pressure was changed, and therefore made it possible to carry out low-pressure molding and low-temperature firing, thus decreasing the manufacturing cost.

Example 6

Powders of $Fe_2O_3$ and CoO weighed in the proportions shown in Table 6 were used as starting materials. Slurry having a predetermined viscosity was obtained by mixing the starting material and water in a wet mixing process carried out in a ball mill for eight hours.

The slurry was then dried and granulated using a spray drier, and the granulated powder was molded under the molding pressures shown in Table 6 in the pressure powder molding process thereby to obtain green bodies.

The green bodies were fired under the firing conditions shown in Table 6, and electromagnetic wave absorber 16 measuring 3 mm×7 mm×0.4 mm and an evaluation sample measuring 20 mm in outer diameter and 2 mm in thickness were made.

Attenuation of electromagnetic wave achieved by installing the electromagnetic wave absorber 16 and volume resistivity of the evaluation sample were measured similarly to Example 1, and the effect of the electromagnetic wave absorber 16 in suppressing resonance was evaluated similarly to Example 1.

Values of attenuation of electromagnetic wave at frequencies of 10, 20 and 40 GHz, volume resistivity and the results of evaluating the effect of suppressing resonance in the frequency region from 10 to 40 GHz are shown in Table 6.

TABLE 6

| No. | Fe$_2$O$_3$ (mol %) | CoO (mol %) | Molding Pressure (MPa) | Firing Temperature (° C.) | Firing Time (hrs.) | Attenuation 10 GHz (dB) | Attenuation 20 GHz (dB) | Attenuation 40 GHz (dB) | Volume Resistivity (Ω · m) | Evoluation of Suppressing Resonance |
|---|---|---|---|---|---|---|---|---|---|---|
| *266 | 35 | 65 | 1400 | 1150 | 1 | 0.3 | 0.5 | 0.7 | $3.3 \times 10^{11}$ | x |
| *267 | 35 | 65 | 1400 | 1200 | 1 | 0.6 | 0.7 | 1.2 | $4.9 \times 10^{10}$ | x |
| *268 | 35 | 65 | 1400 | 1250 | 1 | 0.7 | 0.8 | 0.9 | $3.4 \times 10^{10}$ | x |
| *269 | 35 | 65 | 1400 | 1300 | 1 | 0.9 | 1.0 | 1.4 | $8.7 \times 10^{9}$ | x |
| 270 | 45 | 55 | 1400 | 1150 | 1 | 2.0 | 2.2 | 2.3 | $4.2 \times 10^{8}$ | ○ |
| 271 | 45 | 55 | 1400 | 1200 | 1 | 2.1 | 2.4 | 2.6 | $3.2 \times 10^{8}$ | ○ |
| 272 | 45 | 55 | 1400 | 1250 | 1 | 2.1 | 2.3 | 2.5 | $3.5 \times 10^{8}$ | ○ |
| 273 | 45 | 55 | 1400 | 1300 | 1 | 2.5 | 2.7 | 2.9 | $3.5 \times 10^{8}$ | ○ |
| 274 | 55 | 45 | 1400 | 1150 | 1 | 3.0 | 4.5 | 8.3 | $2.5 \times 10^{5}$ | ○ |
| 275 | 55 | 45 | 1400 | 1200 | 1 | 3.4 | 4.6 | 7.9 | $2.8 \times 10^{5}$ | ○ |
| 276 | 55 | 45 | 1400 | 1250 | 1 | 3.1 | 4.0 | 7.2 | $3.0 \times 10^{5}$ | ○ |
| 277 | 55 | 45 | 1400 | 1300 | 1 | 3.3 | 5.4 | 11.9 | $4.3 \times 10^{2}$ | ○ |
| 278 | 60 | 40 | 1400 | 1150 | 1 | 2.4 | 3.0 | 3.6 | $4.5 \times 10^{5}$ | ○ |
| 279 | 60 | 40 | 1400 | 1200 | 1 | 2.4 | 2.8 | 3.5 | $5.0 \times 10^{5}$ | ○ |
| 280 | 60 | 40 | 1400 | 1250 | 1 | 3.5 | 6.0 | 14.6 | $3.8 \times 10^{2}$ | ○ |
| 281 | 60 | 40 | 1400 | 1300 | 1 | 3.5 | 6.6 | 18.9 | $3.0 \times 10$ | ○ |
| 282 | 70 | 30 | 1400 | 1150 | 1 | 3.4 | 6.4 | 16.9 | $4.3 \times 10$ | ○ |
| 283 | 70 | 30 | 1400 | 1200 | 1 | 3.4 | 6.2 | 16.3 | $4.1 \times 10$ | ○ |
| 284 | 70 | 30 | 1400 | 1250 | 1 | 3.3 | 6.1 | 16.2 | $3.8 \times 10$ | ○ |
| 285 | 70 | 30 | 1400 | 1300 | 1 | 3.3 | 5.9 | 14.2 | $3.5 \times 10^{2}$ | ○ |
| 286 | 80 | 20 | 1400 | 1150 | 1 | 3.2 | 5.5 | 13.9 | $4.3 \times 10^{2}$ | ○ |
| 287 | 80 | 20 | 1400 | 1200 | 1 | 3.3 | 6.7 | 18.1 | $2.3 \times 10$ | ○ |
| 288 | 80 | 20 | 1400 | 1250 | 1 | 3.5 | 6.0 | 16.0 | $4.8 \times 10^{2}$ | ○ |
| 289 | 80 | 20 | 1400 | 1300 | 1 | 3.4 | 5.9 | 15.2 | $4.3 \times 10^{2}$ | ○ |
| 290 | 90 | 10 | 1400 | 1150 | 1 | 2.9 | 4.6 | 9.1 | $5.0 \times 10^{5}$ | ○ |
| 291 | 90 | 10 | 1400 | 1200 | 1 | 3.3 | 5.0 | 10.7 | $4.5 \times 10^{3}$ | ○ |
| 292 | 90 | 10 | 1400 | 1250 | 1 | 3.1 | 5.6 | 15.6 | $4.1 \times 10^{2}$ | ○ |
| 293 | 90 | 10 | 1400 | 1300 | 1 | 3.2 | 5.5 | 12.6 | $4.5 \times 10^{2}$ | ○ |
| 294 | 95 | 5 | 1868 | 1150 | 1 | 2.5 | 2.7 | 3.0 | $5.0 \times 10^{5}$ | ○ |
| 295 | 95 | 5 | 1868 | 1200 | 1 | 2.9 | 4.0 | 4.4 | $5.0 \times 10^{5}$ | ○ |
| 296 | 95 | 5 | 1868 | 1250 | 1 | 2.8 | 3.5 | 6.1 | $5.0 \times 10^{8}$ | ○ |
| 297 | 95 | 5 | 1868 | 1300 | 1 | 3.4 | 11.8 | 13.3 | $4.3 \times 10^{2}$ | ○ |
| *298 | 100 | 0 | 1868 | 1200 | 1 | 0.4 | 0.6 | 1.2 | $4.5 \times 10^{8}$ | x |

Sample numbers marked with * are not within the scope of the present invention.

As can be seen from Table 6, samples Nos. 266 to 269 did not achieve sufficient attenuation of 2 dB or more due to the Fe$_2$O$_3$ content of less than 45%, and allowed resonance to occur with A S$_{21}$ being 0.1 dB or more in the evaluation of resonance suppression.

Sample No. 298 did not contain CoO and, as a result, also did not achieve sufficient attenuation of 2 dB or more and allowed resonance to occur with ΔS$_{21}$ being 0.1 dB or more in the evaluation of resonance suppression.

Samples Nos. 270 to 297 that are examples of the present invention, on the other hand, achieved sufficient attenuation of 2 dB or higher and prevented resonance from occurring, thus showing satisfactory performance as the electromagnetic wave absorber.

Example 7

Powders of Fe$_2$O$_3$, CoO, ZnO and MnO weighed in the proportions shown in Table 7 were used as starting materials. Slurry having a predetermined viscosity was obtained by mixing the starting material and water in a wet mixing process carried out in a ball mill for eight hours.

The slurry was then dried and granulated using a spray drier, and the granulated powder was molded under the molding pressures shown in Table 7 in the pressure powder molding process, thereby to obtain green bodies.

The green bodies were fired under the firing conditions shown in Table 7, and electromagnetic wave absorber 16 measuring 3 mm×7 mm×0.4 mm were made.

Figure 9:
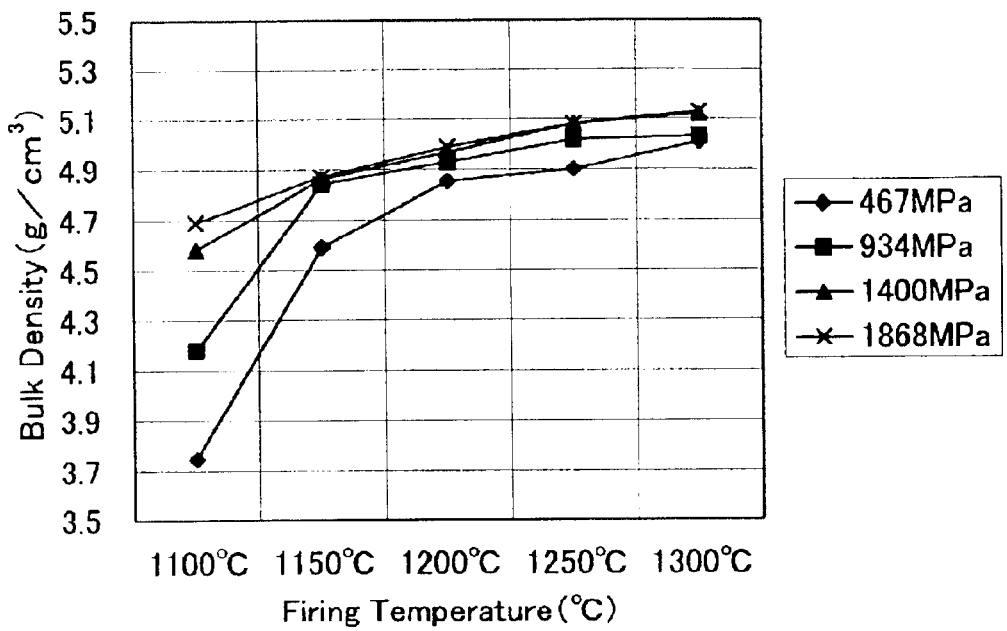
FIG. 9 is a graph showing a relation between the firing temperature and the bulk density of the electromagnetic wave absorber in Example.

Measurements of bulk density of the electromagnetic wave absorber 16 are shown in Table 7. Relationship between the bulk density and the firing temperature is shown in FIG. 9 for samples Nos. 299 to 318 and in FIG. 10 for samples Nos. 319 to 338, according to the molding pressures.

TABLE 7

| No. | Fe$_2$O$_3$ (mol %) | CoO (mol %) | ZnO (mol %) | MnO (mol %) | Molding Pressure (MPa) | Firing Temperature (° C.) | Firing Time (hrs.) | Bulk Density (g/cm$^3$) |
|---|---|---|---|---|---|---|---|---|
| 299 | 70.0 | 30.0 | 0.0 | 0.0 | 467 | 1100 | 1 | 3.75 |
| 300 | 70.0 | 30.0 | 0.0 | 0.0 | 467 | 1150 | 1 | 4.59 |
| 301 | 70.0 | 30.0 | 0.0 | 0.0 | 467 | 1200 | 1 | 4.85 |
| 302 | 70.0 | 30.0 | 0.0 | 0.0 | 467 | 1250 | 1 | 4.90 |
| 303 | 70.0 | 30.0 | 0.0 | 0.0 | 467 | 1300 | 1 | 5.01 |

TABLE 7-continued

| No. | Fe$_2$O$_3$ (mol %) | CoO (mol %) | ZnO (mol %) | MnO (mol %) | Molding Pressure (MPa) | Firing Temperature (° C.) | Firing Time (hrs.) | Bulk Density (g/cm$^3$) |
|---|---|---|---|---|---|---|---|---|
| 304 | 70.0 | 30.0 | 0.0 | 0.0 | 934 | 1100 | 1 | 4.18 |
| 305 | 70.0 | 30.0 | 0.0 | 0.0 | 934 | 1150 | 1 | 4.84 |
| 306 | 70.0 | 30.0 | 0.0 | 0.0 | 934 | 1200 | 1 | 4.93 |
| 307 | 70.0 | 30.0 | 0.0 | 0.0 | 934 | 1250 | 1 | 5.02 |
| 308 | 70.0 | 30.0 | 0.0 | 0.0 | 934 | 1300 | 1 | 5.03 |
| 309 | 70.0 | 30.0 | 0.0 | 0.0 | 1400 | 1100 | 1 | 4.58 |
| 310 | 70.0 | 30.0 | 0.0 | 0.0 | 1400 | 1150 | 1 | 4.86 |
| 311 | 70.0 | 30.0 | 0.0 | 0.0 | 1400 | 1200 | 1 | 4.97 |
| 312 | 70.0 | 30.0 | 0.0 | 0.0 | 1400 | 1250 | 1 | 5.08 |
| 313 | 70.0 | 30.0 | 0.0 | 0.0 | 1400 | 1300 | 1 | 5.12 |
| 314 | 70.0 | 30.0 | 0.0 | 0.0 | 1868 | 1100 | 1 | 4.69 |
| 315 | 70.0 | 30.0 | 0.0 | 0.0 | 1868 | 1150 | 1 | 4.87 |
| 316 | 70.0 | 30.0 | 0.0 | 0.0 | 1868 | 1200 | 1 | 4.99 |
| 317 | 70.0 | 30.0 | 0.0 | 0.0 | 1868 | 1250 | 1 | 5.08 |
| 318 | 70.0 | 30.0 | 0.0 | 0.0 | 1868 | 1300 | 1 | 5.13 |
| 319 | 70.0 | 25.9 | 3.8 | 0.3 | 467 | 1100 | 1 | 4.88 |
| 320 | 70.0 | 25.9 | 3.8 | 0.3 | 467 | 1150 | 1 | 4.95 |
| 321 | 70.0 | 25.9 | 3.8 | 0.3 | 467 | 1200 | 1 | 5.01 |
| 322 | 70.0 | 25.9 | 3.8 | 0.3 | 467 | 1250 | 1 | 5.12 |
| 323 | 70.0 | 25.9 | 3.8 | 0.3 | 467 | 1300 | 1 | 5.13 |
| 324 | 70.0 | 25.9 | 3.8 | 0.3 | 934 | 1100 | 1 | 4.99 |
| 325 | 70.0 | 25.9 | 3.8 | 0.3 | 934 | 1150 | 1 | 5.11 |
| 326 | 70.0 | 25.9 | 3.8 | 0.3 | 934 | 1200 | 1 | 5.14 |
| 327 | 70.0 | 25.9 | 3.8 | 0.3 | 934 | 1250 | 1 | 5.16 |
| 328 | 70.0 | 25.9 | 3.8 | 0.3 | 934 | 1300 | 1 | 5.17 |
| 329 | 70.0 | 25.9 | 3.8 | 0.3 | 1400 | 1100 | 1 | 5.00 |
| 330 | 70.0 | 25.9 | 3.8 | 0.3 | 1400 | 1150 | 1 | 5.13 |
| 331 | 70.0 | 25.9 | 3.8 | 0.3 | 1400 | 1200 | 1 | 5.20 |
| 332 | 70.0 | 25.9 | 3.8 | 0.3 | 1400 | 1250 | 1 | 5.21 |
| 333 | 70.0 | 25.9 | 3.8 | 0.3 | 1400 | 1300 | 1 | 5.22 |
| 334 | 70.0 | 25.9 | 3.8 | 0.3 | 1868 | 1100 | 1 | 5.03 |
| 335 | 70.0 | 25.9 | 3.8 | 0.3 | 1868 | 1150 | 1 | 5.14 |
| 336 | 70.0 | 25.9 | 3.8 | 0.3 | 1868 | 1200 | 1 | 5.17 |
| 337 | 70.0 | 25.9 | 3.8 | 0.3 | 1868 | 1250 | 1 | 5.23 |
| 338 | 70.0 | 25.9 | 3.8 | 0.3 | 1868 | 1300 | 1 | 5.23 |

As can be seen from FIG. 9, bulk density varied significantly with the molding pressure in samples Nos. 299 to 318 since these samples did not contain ZnO, making it impossible to carry out low-pressure molding or low-temperature firing in some cases.

Figure 10:
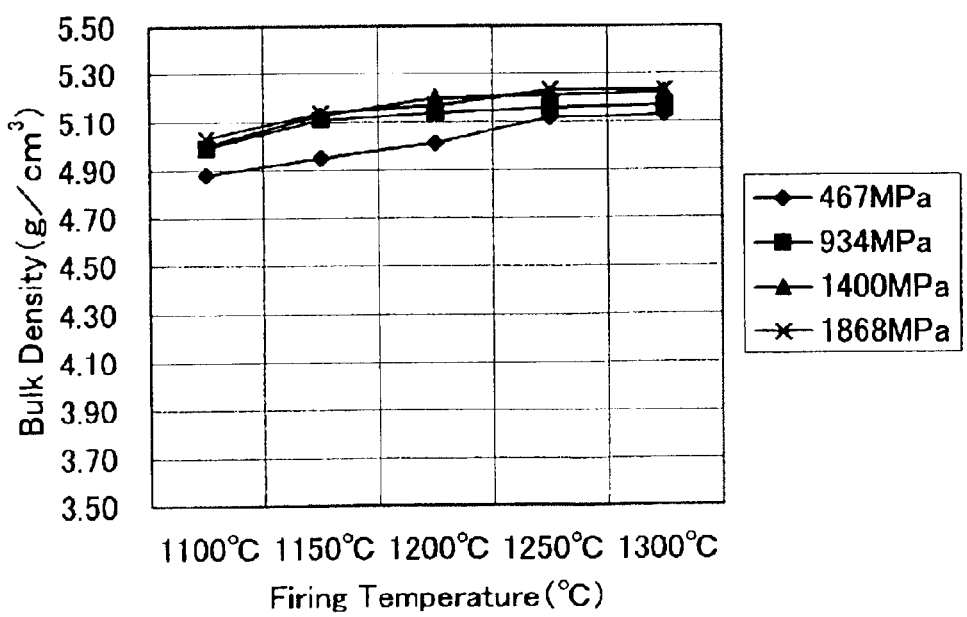
FIG. 10 is a graph showing a relation between the firing temperature and the bulk density of the electromagnetic wave absorber in Example.
Figure 11:
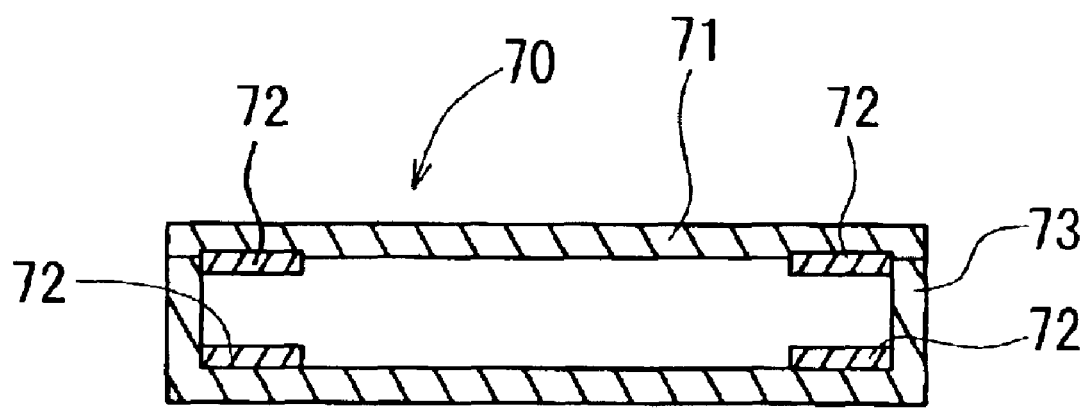
FIG. 11 is a sectional view of a high-frequency circuit package provided with an electromagnetic wave absorber of the prior art.

Samples Nos. 319 to 338, on the other hand, as shown in FIG. 10, contained ZnO and showed substantially constant bulk density when the molding pressure was changed, and therefore made it possible to carry out low-pressure molding and low-temperature firing, thus decreasing the manufacturing cost.

It is understood that the present invention is not limited to the examples described above, and various modifications can be made without departing from the scope of the present invention.

What is claimed is:

1. An electromagnetic wave absorber comprising a sintered body that contains Fe and at least one element seleeted from the group consisting of Si, Mg, Zr, Ni, Al and Co, wherein attenuation of electromagnetic wave of said sintered body is 2 dB or more at frequencies of 10 GHz or higher, wherein volume resistivity of said sintered body is $5 \times 10^5$ Ω·m or lower.

2. The electromagnetic wave absorber according to claim 1, wherein said sintered body contains 20 to 95 mol% of Fe on Fe$_2$O$_3$ basis, and 5 to 80 mol% in total of at least one element selected from Si, Mg and Zr on SiO$_2$, MgO and/or ZrO$_2$ basis.

3. The electromagnetic wave absorber according to claim 2, wherein said sintered body also contains 1 to 50 mol% of Al on Al$_2$O$_3$ basis.

4. The electromagnetic wave absorber according to claim 2, wherein the Fe content is from 40 to 90 mol % on Fe$_2$O$_3$ basis.

5. The electromagnetic wave absorber according to claim 1, wherein said sintered body contains Fe$_2$O$_3$ as a major component, and the remainder contains NiO while the content of Fe$_2$O$_3$ is from 70 to 95 mol %.

6. The electromagnetic wave absorber according to claim 5, wherein said remainder contains at least one selected from the group consisting of ZnO, CuO and Bi$_2$O$_3$.

7. The electromagnetic wave absorber according to claim 1, wherein said sintered body contains 20 mol % or more of Fe$_2$O$_3$ and 80 mol % or less of Al$_2$O$_3$.

8. The electromagnetic wave absorber according to claim 7, wherein the content of Fe$_2$O$_3$ is from 40 to 90 mol %.

9. The electromagnetic wave absorber according to claim 7, wherein the remainder other than Fe$_2$O$_3$ and Al$_2$O$_3$ contains at least one selected from the group consisting of ZnO, CuO and Bi$_2$O$_3$.

10. The electromagnetic wave absorber according to claim 1, wherein said sintered body contains 45 mol % or more of Fe$_2$O$_3$ and 55 mol % or less of CoO.

11. The electromagnetic wave absorber according to claim 10, wherein the content of Fe$_2$O$_3$ is from 55 to 90 mol %.

12. The electromagnetic wave absorber according to claim 10, wherein the remainder other than Fe$_2$O$_3$ and CoO contains at least one selected from the group consisting of ZnO, MnO, NiO, CuO and Bi$_2$O$_3$.

13. A high-frequency circuit package comprising a package base and a package lid attached onto said package base, wherein the electromagnetic wave absorber of claim 1, is installed therein.

14. A high-frequency circuit package comprising a package base and a package lid attached onto said package base, wherein said package lid is formed from an electromagnetic wave absorber comprising a sintered body that contains Fe and at least one element selected from the group consisting of Si, Me, Zr, Ni, Al and Co, wherein attenuation of electromagnetic wave of said sintered body is 2 dB or more at frequencies of 10 GHz or higher.

15. The high-frequency circuit package according to claim 14, wherein said sintered body contains 20 to 95 mol % of Fe on $Fe_2O_3$ basis, and 5 to 80 mol % in total of at least one element selected from Si, Mg and Zr on $SiO_2$, MgO and/or $ZrO_2$ basis.

16. The high-frequency circuit package according to claim 14, wherein said sintered body contains $Fe_2O_3$ as a major component, and the remainder contains NiO while the content of $Fe_2O_3$ is from 70 to 95 mol %.

17. The high-frequency circuit package according to claim 14, wherein said sintered body contains 20 mol % or more of $Fe_2O_3$ and 80 mol % or less of $Al_2O_3$.

18. The high-frequency circuit package according to claim 14, wherein said sintered body contains 45 mol % or more of $Fe_2O_3$ and 55 mol % or less of CoO.

19. The high-frequency circuit package according to claim 15, wherein said sintered body also contains 1 to 50 mol % of Al on $Al_2O_3$ basis.

20. The high-frequency circuit package according to claim 15, wherein the Fe content is from 40 to 90 mol % on $Fe_2O_3$ basis.

* * * * *